United States Patent
Inoue et al.

(10) Patent No.: US 10,811,577 B2
(45) Date of Patent: *Oct. 20, 2020

(54) SEMICONDUCTOR LIGHT EMITTING ELEMENT AND METHOD FOR MANUFACTURING THE SAME

(71) Applicants: NATIONAL INSTITUTE OF INFORMATION AND COMMUNICATIONS TECHNOLOGY, Koganei-shi, Tokyo (JP); STANLEY ELECTRIC CO., LTD., Meguro-ku, Tokyo (JP)

(72) Inventors: Shinichiro Inoue, Koganei (JP); Naoki Tamari, Shunan (JP)

(73) Assignees: NATIONAL INSTITUTE OF INFORMATION AND COMMUNICATIONS TECHNOLOGY, Tokyo (JP); STANLEY ELECTRIC CO., LTD., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/963,544

(22) Filed: Apr. 26, 2018

(65) Prior Publication Data
US 2018/0248088 A1 Aug. 30, 2018

Related U.S. Application Data

(63) Continuation of application No. 14/907,650, filed as application No. PCT/JP2014/069705 on Jul. 25, 2014.

(30) Foreign Application Priority Data

Jul. 30, 2013 (JP) .................................. 2013-158300

(51) Int. Cl.
*H01L 33/58* (2010.01)
*H01L 33/00* (2010.01)
(Continued)

(52) U.S. Cl.
CPC .......... *H01L 33/58* (2013.01); *H01L 33/0062* (2013.01); *H01L 33/22* (2013.01);
(Continued)

(58) Field of Classification Search
CPC ......... H01L 33/58; H01L 33/32; H01L 33/22; H01L 2933/0058; H01L 33/0062; H01L 1133/0062
See application file for complete search history.

(56) References Cited

U.S. PATENT DOCUMENTS

2013/0119424 A1* 5/2013 Kang ...................... H01L 33/20
257/98
2013/0126924 A1* 5/2013 Chen ...................... H01L 33/22
257/98
(Continued)

FOREIGN PATENT DOCUMENTS

KR 10-2013-0054041 A 5/2013

OTHER PUBLICATIONS

Inoue et al., "Semiconductor Light Emitting Element and Method for Manufacturing the Same", U.S. Appl. No. 14/907,650, filed Jan. 26, 2016.
(Continued)

*Primary Examiner* — Feifei Yeung Lopez
(74) *Attorney, Agent, or Firm* — Keating & Bennett, LLP

(57) ABSTRACT

The semiconductor light emitting element is a semiconductor light emitting element comprising a semiconductor layer including a light emitting layer, wherein a surface of the semiconductor light emitting element includes a light extraction surface. At least one of the light extraction surface and
(Continued)

an interface between two layers having different refractive indexes in the semiconductor light emitting element is provided with a periodic recessed and projecting structure having a period that exceeds 0.5 times as great as a wavelength of light emitted from the light emitting layer, and a minute recessed and projecting structure located on a surface of the periodic recessed and projecting structure and having an average diameter that is not more than 0.5 times as great as the wavelength of the light.

7 Claims, 20 Drawing Sheets

(51) Int. Cl.
*H01L 33/22* (2010.01)
*H01L 33/32* (2010.01)

(52) U.S. Cl.
CPC ...... *H01L 33/32* (2013.01); *H01L 2933/0058* (2013.01); *H01L 2933/0083* (2013.01)

(56) References Cited

U.S. PATENT DOCUMENTS

2014/0225099 A1* 8/2014 Yamae .................. H01L 51/524
257/40
2016/0149076 A1* 5/2016 Kitano .................... H01L 33/10
257/98

OTHER PUBLICATIONS

Official Communication issued in corresponding Korean Patent Application No. 10-2016-7004348, dated May 20, 2020.

\* cited by examiner

SEMICONDUCTOR LIGHT EMITTING ELEMENT AND METHOD FOR MANUFACTURING THE SAME

TECHNICAL FIELD

The present invention relates to a semiconductor light emitting element such as a light emitting diode (LED), and particularly to a semiconductor light emitting element improved in light extraction of the light emitted inside the element to the outside, and a method for manufacturing the semiconductor light emitting element.

BACKGROUND ART

A semiconductor light emitting element is formed of several layers such as a light emitting layer, an n-type semiconductor layer, a p-type semiconductor layer, an electrode layer, and a supporting substrate. Therefore, the light emitted in the light emitting layer inside the semiconductor element is extracted to the outside after having passed through these several layers. However, when the light passes through a boundary between media having different refractive indexes, i.e., an interface between layers or a surface, a certain rate of reflection occurs inevitably. In addition, when the light passes through or is reflected from a medium layer having an absorption coefficient for a wavelength (emission wavelength) of the aforementioned light, a certain rate of light absorption occurs. Therefore, it is generally difficult to efficiently extract the light emitted in the light emitting layer to the outside of the semiconductor light emitting element.

Particularly when the light travels from a medium having a high refractive index to a medium having a low refractive index, total reflection of the light occurs and the light having an angle equal to or larger than a critical angle cannot be extracted to the outside. On the surface of the semiconductor light emitting element, i.e., an interface between the air (or a sealing material) and the semiconductor element, a difference in refractive index between the media is large, and thus, the critical angle at which total reflection occurs becomes small, which results in an increase in ratio of the light totally reflected from the interface.

For example, a refractive index n of a sapphire substrate is 1.8 and a critical angle to the air is 33.7 degrees. Namely, when a sapphire substrate is used as the substrate forming the semiconductor light emitting element and when the light is extracted through the sapphire substrate to the air side, the light having an incidence angle larger than 33.7 degrees is totally reflected and cannot be extracted to the outside. In the case of an aluminum nitride (AlN) substrate having a larger refractive index (refractive index n=2.29), a critical angle is 25.9 degrees and only a smaller amount of the light can be extracted to the outside.

By using theoretical calculation of the light radiation propagation property with a finite-difference time-domain method (FDTD method), the light extraction efficiency in a semiconductor light emitting element having an AlGaN layer stacked on an AlN substrate was calculated, for example. As a result, considering absorption or the like by a p-type GaN layer located opposite to the AlN substrate as seen from a light emitting portion inside the AlGaN layer, the extraction efficiency of the light that can be extracted from the surface (light extraction surface) side of the AlN substrate, of the light with a wavelength of 265 nm radiated from the light emitting portion, is extremely low, i.e., about 4%.

In order to deal with the aforementioned problem, there has been proposed a semiconductor light emitting element having a nanometer-scale recessed and projecting structure on a substrate surface (light extraction surface). For example, PTD 1 discloses that a light extraction surface is provided with a recessed and projecting structure having an average period that is not more than twice as great as an average optical wavelength of the light emitted from a light emitting layer. PTD 1 proposes a method for reducing a ratio of the light totally reflected from the light extraction surface (i.e., suppressing reflection of the light from the element surface), by forming the aforementioned recessed and projecting configuration. However, it is not easy to form the nanometer-scale recessed and projecting structure on the surface of the semiconductor light emitting element. In addition, the light extraction efficiency greatly varies depending on the shape of the recessed and projecting structure and the emission wavelength, and thus, the effect is not sufficiently obtained.

As the emission wavelength becomes shorter, the required period of the recessed and projecting structure (e.g., in the case of a projecting structure, a distance between a vertex portion of a projecting structure and a vertex portion of an adjacent projecting structure) becomes shorter, and thus, fabrication of the recessed and projecting structure becomes difficult. Particularly in a semiconductor light emitting element that emits the light in an ultraviolet or deep ultraviolet wavelength range, it is difficult to fabricate the recessed and projecting structure of such size by optical lithography. As a result, problems such as an increase in fabrication cost and a reduction in yield and productivity arise, and thus, fabrication of such recessed and projecting structure is not practical.

PTD 1 (Japanese Patent Laying-Open No. 2005-354020) discloses a method for heating and flocculating a deposited metal to form a nanometer-sized minute metal mask, forming the nanometer-sized minute metal mask on the light extraction surface, and etching a surface of the light extraction surface, in order to form the nanometer-scale periodic recessed and projecting structure. However, in the case of the aforementioned periodic mask using the flocculation effect, arrangement of the recessed and projecting structure is random and the non-uniformity of a shape thereof is high. Therefore, variations in power of the light output from the semiconductor light emitting element to the outside are large and it is difficult to provide a semiconductor light emitting element that emits the stable and uniform light.

NPD 1 (ISDRS 2011, Dec. 7-9, 2011, College Park, Md., USA, WP2-04) discloses a method for roughening a substrate surface by wet etching in order to form a nanometer-scale recessed and projecting structure. However, the recessed and projecting structure formed by a method using wet etching also has a random structure having a non-uniform shape. Therefore, the light extraction efficiency greatly varies and the effect of enhancing the light extraction efficiency is also insufficient.

According to NPD 2 (Appl. Phys. Express 3 (2010) 061004), in a semiconductor light emitting element that emits the deep ultraviolet light, a surface periodic recessed and projecting structure is provided by lithography and dry etching. However, a period of the recessed and projecting structure is 500 nm, which is approximately twice as great as an emission wavelength, and the effect of enhancing the light extraction efficiency is not sufficiently obtained. In addition, variations in light output are extremely large.

CITATION LIST

Patent Document

PTD 1: Japanese Patent Laying-Open No. 2005-354020

Non Patent Document

NPD 1: ISDRS 2011, Dec. 7-9, 2011, College Park, Md., USA, WP2-04
NPD 2: Appl. Phys. Express 3 (2010) 061004

SUMMARY OF INVENTION

Technical Problem

As described above, the semiconductor light emitting element having the nanometer-scale recessed and projecting structure on the substrate surface (light extraction surface) has been proposed to enhance the light extraction efficiency. However, in such conventional light emitting element, optimum values of the period of the recessed and projecting structure, the height and shape of the projection forming the recessed and projecting structure, and the like are uncertain and vary depending on the emission wavelength, the refractive index of the substrate, and the like. Therefore, the sufficient effect is not produced under the present circumstances. Furthermore, as the emission wavelength becomes shorter, a smaller-scale recessed and projecting structure needs to be formed on the substrate surface (light extraction surface), and thus, fabrication of the recessed and projecting structure becomes more difficult. Therefore, a great challenge is to reproducibly and uniformly form the recessed and projecting structure that sufficiently enhances the light extraction efficiency, and further to make uniform and stable the power of the light output from the semiconductor light emitting element to the outside, even if the emission wavelength is short.

Accordingly, an object of the present invention is to solve the conventional problem described above, and to provide a semiconductor light emitting element that achieves high light extraction efficiency and uniform light output even if an emission wavelength is short, and a method for manufacturing the semiconductor light emitting element by which the semiconductor light emitting element can be manufactured with high reproducibility and high productivity.

Solution to Problem

A semiconductor light emitting element according to the present invention is a semiconductor light emitting element comprising a semiconductor layer including a light emitting layer, wherein a surface of the semiconductor light emitting element includes a light extraction surface. At least one of the light extraction surface and an interface between two layers having different refractive indexes in the semiconductor light emitting element is provided with a periodic recessed and projecting structure having a period that exceeds 0.5 times as great as a wavelength of light emitted from the light emitting layer, and a minute recessed and projecting structure located on a surface of the periodic recessed and projecting structure and having an average diameter that is not more than 0.5 times as great as the wavelength of the light.

Advantageous Effects of Invention

According to the present invention, the semiconductor light emitting element that achieves high light extraction efficiency can be obtained.

DESCRIPTION OF EMBODIMENTS

Figure 1:
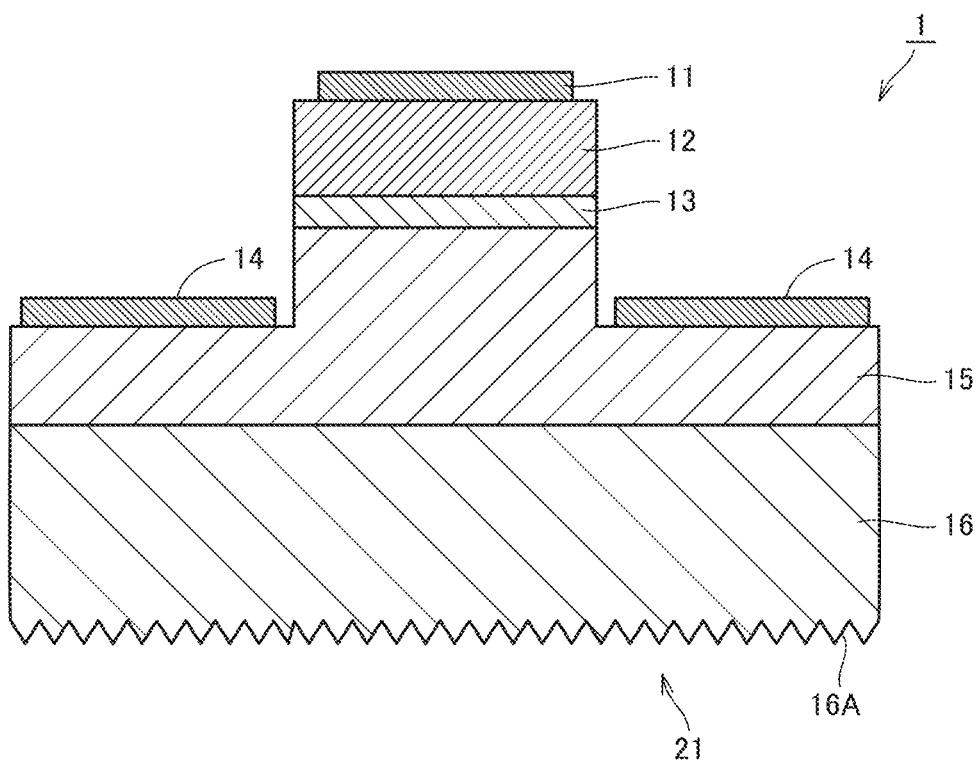
FIG. 1 is a schematic cross-sectional view of a first embodiment of a semiconductor light emitting element according to the present invention.

First, an overview of an embodiment will be described.

(1) A semiconductor light emitting element according to the present embodiment is a semiconductor light emitting element comprising a semiconductor layer including a light emitting layer (active layer 13), wherein a surface of the semiconductor light emitting element includes a light extraction surface, and at least one of the light extraction surface and an interface between two layers having different refractive indexes in the semiconductor light emitting element is provided with a periodic recessed and projecting structure 21 having a period that exceeds 0.5 times as great as a wavelength of light emitted from the light emitting layer, and a minute recessed and projecting structure 22 located on a surface of periodic recessed and projecting structure 21 and having an average diameter that is not more than 0.5 times as great as the wavelength of the light.

With such a configuration, periodic recessed and projecting structure 21 having the period corresponding to the wavelength (emission wavelength) of the light emitted from the light emitting layer and minute recessed and projecting structure 22 having the average diameter corresponding to this wavelength are formed on the light extraction surface. Therefore, the light extraction efficiency can be reliably enhanced as compared with the case of not having these recessed and projecting structures on the light extraction surface. Namely, even when a periodic recessed and projecting structure having a period greater than the wavelength is formed, the light extraction efficiency can be sufficiently enhanced by combining the periodic recessed and projecting structure with a minute recessed and projecting structure. Furthermore, when the emission wavelength is short (e.g., equal to or shorter than 450 nm, or equal to or shorter than 350 nm), the effect of suppressing an increase in cost related to manufacturing of the periodic recessed and projecting structure is remarkable in the semiconductor light emitting element according to the present embodiment. In addition, since the periodic recessed and projecting structure can be formed with the period greater than the emission wavelength, formation of the uniform recessed and projecting structure is easy.

(2) In the aforementioned semiconductor light emitting element, an arrangement pattern of periodic recessed and projecting structure 21 may be a triangular lattice-like pattern. In this case, the number per unit area of projecting portions of periodic recessed and projecting structure 21 can be easily increased.

(3) In the aforementioned semiconductor light emitting element, periodic recessed and projecting structure 21 may include a projection (projecting portion) made of a high refractive index material having a refractive index higher than that of the air. A cross-sectional area of the projection at a surface perpendicular to a direction toward the light extraction surface (rear surface 16A of substrate 16) from the light emitting layer (active layer 13) may become smaller with increasing distance from the light emitting layer (active layer 13). With such a configuration, when an external medium to the light extraction surface is the air, the efficiency of light extraction from the light extraction surface can be reliably enhanced.

(4) In the aforementioned semiconductor light emitting element, the projection may have a conical shape or a semi-elliptical spherical shape. In this case, the projection can be easily formed by using a relatively common process such as etching.

(5) In the aforementioned semiconductor light emitting element, the light emitting layer may include a group-III nitride semiconductor. The semiconductor layer may include: an n-type group-III nitride semiconductor layer (n-type semiconductor layer 15) having an n-type conductivity; and a p-type group-III nitride semiconductor layer (p-type semiconductor layer 12) located opposite to the n-type group-III nitride semiconductor layer as seen from the light emitting layer and having a p-type conductivity. By using the aforementioned group-III nitride semiconductor, the semiconductor light emitting element that emits the short-wavelength light having an emission wavelength equal to or shorter than 450 nm can be obtained.

(6) The aforementioned semiconductor light emitting element may further include a transparent substrate arranged on the light extraction surface side as seen from the light emitting layer and having transparency to the light emitted from the light emitting layer. In this case, the rear surface (rear surface opposite to a main surface having the semiconductor layer formed thereon) of the transparent substrate can be used as the light extraction surface.

(7) In the aforementioned semiconductor light emitting element, the transparent substrate may be an aluminum nitride substrate. In this case, a defect density of the semiconductor layer including the light emitting layer formed of the group-III nitride semiconductor can be significantly reduced.

(8) In the aforementioned semiconductor light emitting element, the wavelength of the light emitted from the light emitting layer may be equal to or shorter than 450 nm. When the emission wavelength is short as described above, the aforementioned effect can be remarkably obtained.

(9) In the aforementioned semiconductor light emitting element, a height H1 of periodic recessed and projecting structure 21 may be not less than ⅓ times and not more than 5 times as great as period L1 of periodic recessed and projecting structure 21, and an average height of minute recessed and projecting structure 22 may be not less than 0.1 times and not more than 10 times as great as the average diameter of minute recessed and projecting structure 22. In this case, the light extraction efficiency can be reliably enhanced.

(10) A semiconductor light emitting element according to the present embodiment includes: a substrate 16 made of aluminum nitride; and a semiconductor layer formed on a main surface of substrate 16. The semiconductor layer includes: a light emitting layer (active layer 13) including a group-III nitride semiconductor; and an n-type group-III nitride semiconductor layer (n-type semiconductor layer 15) having an n-type conductivity and a p-type group-III nitride semiconductor layer (p-type semiconductor layer 12) having a p-type conductivity, the n-type group-III nitride semiconductor layer and the p-type group-III nitride semiconductor layer being arranged to sandwich the light emitting layer. A wavelength of light emitted from the light emitting layer is equal to or shorter than 350 nm. A rear surface of substrate 16 located opposite to the main surface is provided with a periodic recessed and projecting structure 21 having a period that is not less than ⅓ times and not more than 5 times as great as a value (evaluated value) obtained by dividing the wavelength of the light emitted from the light emitting layer by a difference between a refractive index of the aluminum nitride forming the substrate and a refractive index of an external medium located outside the substrate.

In this case, the period of periodic recessed and projecting structure 21 is determined in accordance with the wavelength (emission wavelength) of the light emitted from the light emitting layer, the refractive index of substrate 16 made of AlN, and the refractive index of the external medium. Therefore, the efficiency of light extraction from the rear surface (light extraction surface) of substrate 16 can be reliably enhanced.

The aforementioned period is preferably not less than 0.5 times and not more than 4 times, and more preferably not less than 1 time and not more than 3 times as great as the evaluated value.

(11) In the aforementioned semiconductor light emitting element, an arrangement pattern of periodic recessed and projecting structure 21 may be a triangular lattice-like pattern. In this case, the number per unit area of projecting portions of periodic recessed and projecting structure 21 can be easily increased.

(12) In the aforementioned semiconductor light emitting element, the periodic recessed and projecting structure may include a projection, and the projection may have a conical shape or a semi-elliptical spherical shape. In this case, the projection can be easily formed by using a relatively common process such as etching.

(13) In the aforementioned semiconductor light emitting element, a height of the periodic recessed and projecting structure may be not less than $\frac{1}{3}$ times and not more than 5 times as great as the period of the periodic recessed and projecting structure. In this case, the light extraction efficiency can be reliably enhanced. The aforementioned height is preferably not less than 0.5 times and not more than twice, and more preferably not less than 0.6 times and not more than 1.8 times as great as the evaluated value.

(14) A method for manufacturing a semiconductor light emitting element according to the present embodiment includes the steps of: preparing an element member that should form a semiconductor light emitting element including a semiconductor layer having a light emitting layer; forming a mask layer having a pattern on a region of the element member that should form a light extraction surface of the semiconductor light emitting element; and forming a periodic recessed and projecting structure by partially removing the region that should form the light extraction surface by etching using the mask layer as a mask. The mask layer is a metal mask layer. In the step of forming a periodic recessed and projecting structure, by performing dry etching using a fluorine-based gas as an etching gas, the periodic recessed and projecting structure is formed and a minute recessed and projecting structure is formed on a surface of the periodic recessed and projecting structure in a step of removing a residue of the mask layer. The periodic recessed and projecting structure has a period that exceeds 0.5 times as great as a wavelength of light emitted from the light emitting layer. The minute recessed and projecting structure has an average diameter that is not more than 0.5 times as great as the wavelength of the light. In addition, the periodic recessed and projecting structure and the minute recessed and projecting structure are characterized by being made of the same material. With such a configuration, the semiconductor light emitting element according to the present embodiment can be easily obtained.

(15) A method for manufacturing a semiconductor light emitting element according to the present embodiment includes the steps of: preparing a substrate made of aluminum nitride, and an element member that is formed on a main surface of the substrate and should form a semiconductor light emitting element including a semiconductor layer having a light emitting layer; forming a mask layer having a pattern on a region of the element member that should form a light extraction surface of the semiconductor light emitting element; and forming a periodic recessed and projecting structure by partially removing the region that should form the light extraction surface by etching using the mask layer as a mask. The periodic recessed and projecting structure has a period that is not less than $\frac{1}{3}$ times and not more than 5 times as great as a value obtained by dividing a wavelength of light emitted from the light emitting layer by a difference between a refractive index of the aluminum nitride forming the substrate and a refractive index of an external medium located outside the substrate. With such a configuration, the semiconductor light emitting element according to the present embodiment can be easily obtained.

(16) In the aforementioned semiconductor light emitting element, the period of periodic recessed and projecting structure 21 may be not less than 1 time as great as the wavelength of the light. In this case, periodic recessed and projecting structure 21 can be easily manufactured.

(17) In the aforementioned semiconductor light emitting element, the period of periodic recessed and projecting structure 21 may be not less than twice as great as the wavelength of the light. In addition, an average diameter of minute recessed and projecting structure 22 may be not more than 0.4 times as great as the wavelength of the light. In this case, an increase in manufacturing cost of the semiconductor light emitting element can be avoided and the light extraction efficiency can be reliably enhanced.

(18) In the aforementioned semiconductor light emitting element, the transparent substrate may be a sapphire substrate. With such a configuration as well, the semiconductor light emitting element with enhanced light extraction efficiency can be obtained.

(19) In the aforementioned semiconductor light emitting element, the wavelength (emission wavelength) of the light emitted from the light emitting layer may be equal to or shorter than 350 nm. In this case, the effect of the present embodiment is remarkable in the semiconductor light emitting element that emits the short-wavelength light described above.

Next, a specific example of the embodiment of the present invention will be described with reference to the drawings as appropriate. A light emitting element described below is for embodying the technical idea of the present invention and does not limit the present invention to the following. Particularly, dimensions, materials, shapes, and other relative arrangements of components described below are not intended to limit the scope of the present invention to such values unless specified to the contrary, and are merely description examples. Sizes, positional relations and the like of members shown in each figure may be exaggerated to clarify the description. In addition, the elements constituting the present invention may be configured such that a plurality of elements are formed by the same member and this one member serves as the plurality of elements, or conversely, may be configured such that the function of one member is shared by a plurality of members. Furthermore, in the below-described embodiments as well, the configurations and the like can be combined as appropriate and applied, unless otherwise excluded.

First Embodiment

Figure 2:
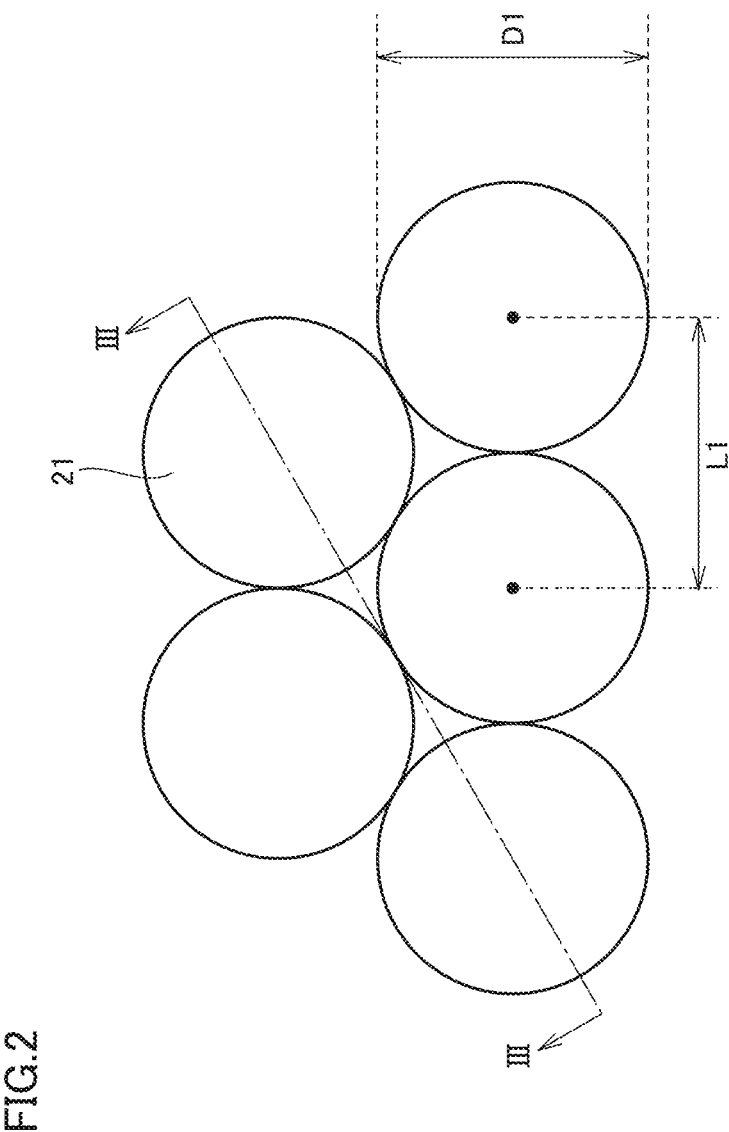
FIG. 2 is a schematic plan view of a light extraction surface of the semiconductor light emitting element shown in FIG. 1.
Figure 3:
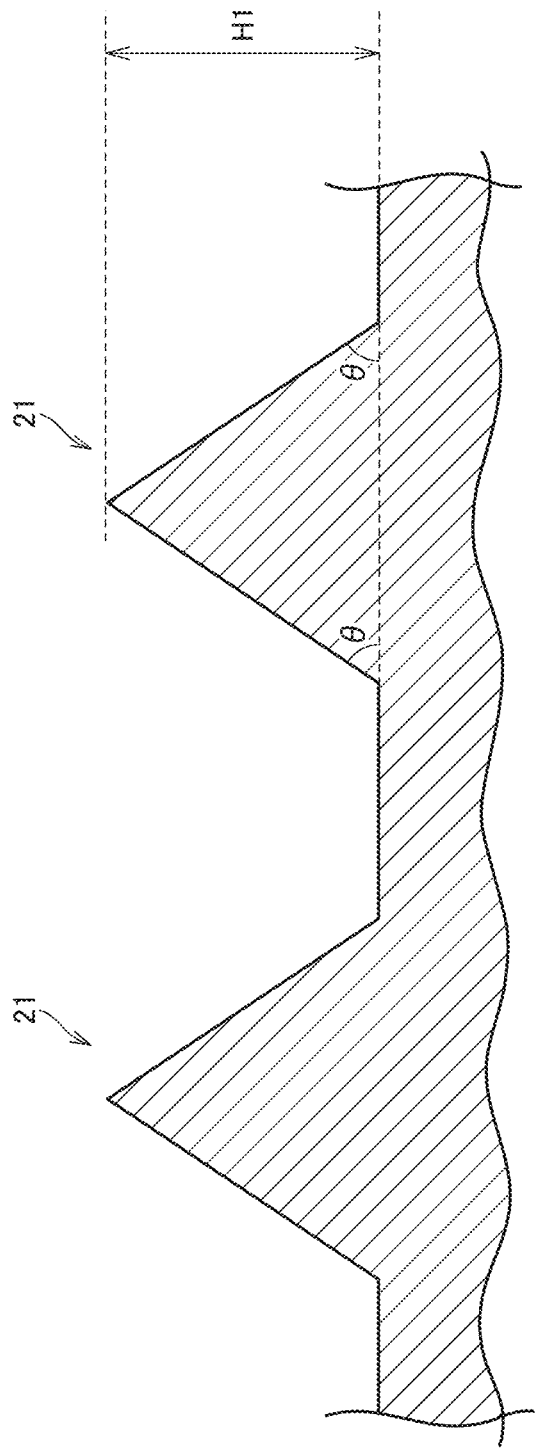
FIG. 3 is a schematic partial cross-sectional view taken along line in FIG. 2.

FIGS. 1 to 3 conceptually show a structure of a semiconductor light emitting element according to a first embodiment of the present invention. Referring to FIGS. 1 to 3, the semiconductor light emitting element mainly includes a substrate 16 made of MN (aluminum nitride), an n-type semiconductor layer 15, an active layer 13, a p-type semiconductor layer 12, a positive electrode 11, and a negative electrode 14. N-type semiconductor layer 15 is formed on a main surface of substrate 16. A projection is formed on a part of a surface of n-type semiconductor layer 15, and active layer 13 is formed on this projection. P-type semiconductor layer 12 is formed on active layer 13. Positive electrode 11 is formed on p-type semiconductor layer 12. In addition, negative electrode 14 is formed in a region on the surface of n-type semiconductor layer 15 where the aforementioned projection is not formed.

A wavelength of the light emitted from active layer 13 serving as a light emitting layer is equal to or shorter than 350 nm. A rear surface of substrate 16 located opposite to the main surface is provided with a periodic recessed and projecting structure 21 having a period L1 that is not less than ⅓ times and not more than 5 times as great as a value (reference value) obtained by dividing the wavelength of the light emitted from active layer 13 by a difference between a refractive index of aluminum nitride forming substrate 16 and a refractive index of the air which is an external medium located outside substrate 16.

The components will be described below individually.

<Substrate>

A substrate which allows a nitride semiconductor crystal to be epitaxially grown on a surface thereof and which satisfies a condition that a transmittance is high with respect to the wavelength range of the light emitted by the semiconductor light emitting element (e.g., the light transmittance is equal to or higher than 50%) can be selected and used as substrate 16. Examples of a material of substrate 16 include AlN described above, sapphire, GaN and the like.

Figure 4:
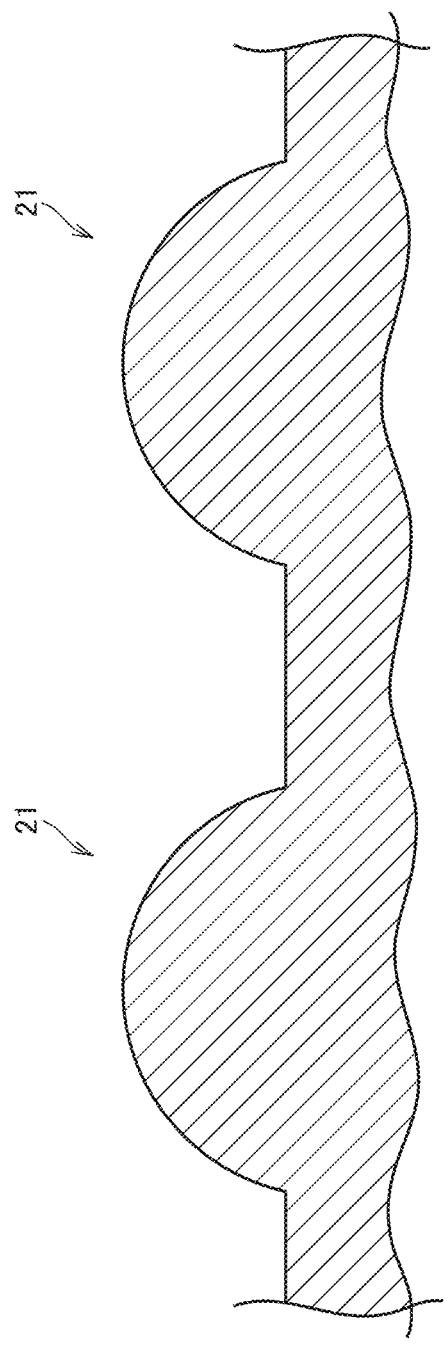
FIG. 4 is a schematic plan view for describing a modification of the semiconductor light emitting element shown in FIG. 1.

As described above, substrate 16 is provided with periodic recessed and projecting structure 21 on the light extraction surface (rear surface). Specifically, periodic recessed and projecting structure 21 includes a projecting portion, and this projecting portion has a conical shape (e.g., a conical shape having a diameter D1 of a bottom surface, a height H1 from the bottom surface to a vertex, and an angle θ formed by a side surface and the bottom surface) as shown in FIGS. 2 and 3. The projecting portion may have a semi-elliptical spherical shape as shown in FIG. 4.

Arrangement of the periodic recessed and projecting structure (arrangement of the projecting portion) may be periodic arrangement such as triangular lattice arrangement, square lattice arrangement and hexagonal lattice arrangement, and is preferably triangular lattice arrangement that achieves the maximum filling factor. Furthermore, periodic recessed and projecting structure 21 may have period L1 that is not less than ⅓ times and not more than 5 times as great as the value (reference value) obtained by dividing the emission wavelength of the semiconductor light emitting element by the difference between the refractive index of aluminum nitride forming substrate 16 and the refractive index of the air which is the external medium located outside substrate 16. In addition, it is preferable that height H1 of periodic recessed and projecting structure 21 is within a range of not less than ⅓ times and not more than 5 times as great as period L1.

Period L1 of periodic recessed and projecting structure 21 described above is more preferably not less than 0.5 times and not more than 4 times, and further preferably not less than 1 time and not more than 3 times, as great as the aforementioned reference value. With such a configuration, the light extraction efficiency can be enhanced more reliably. In addition, height H1 of periodic recessed and projecting structure 21 is preferably not less than 0.5 times and not more than twice, and more preferably not less than 0.6 times and not more than 1.8 times, as great as period L1. With such a configuration as well, the light extraction efficiency can be enhanced more reliably.

Next, a method for fabricating periodic recessed and projecting structure 21 will be described below. Periodic recessed and projecting structure 21 can be fabricated by a process including firstly an etching mask fabrication step (step (S41) in FIG. 5), secondly an etching step (step (S42) in FIG. 5), and thirdly a mask removal step (step (S43) in FIG. 5). The etching mask fabrication step is a step of fabricating an etching mask pattern on the rear surface of substrate 16, and an arbitrary method such as an electron beam lithography method, an optical lithography method and a nanoimprint lithography method can be applied. Alternatively, in order to enhance an etching selectivity in the etching step, a metal mask pattern may be fabricated by forming a mask pattern (e.g., resist mask) having a pattern by the aforementioned arbitrary method, and then, depositing a metal to cover the mask pattern, and then, removing a part of the metal together with the mask pattern by a liftoff method.

By using the mask pattern as the etching mask, the rear surface of substrate 16 is etched to form a desired pattern on the rear surface of substrate 16. Dry etching such as inductively-coupled plasma (ICP) etching and reactive ion etching (RIE), wet etching using an acid solution or an alkaline solution as an etchant, or the like can be applied as a method for etching. In order to form a highly periodic pattern, it is preferable to apply dry etching. In the etching step using dry etching, a resin material such as a resist or a metal can be used as an etching mask, and a chlorine-based gas, a fluorine-based gas, a bromine-based gas or the like can be applied as an etching gas. Furthermore, a gas obtained by mixing hydrogen, oxygen or the like with the aforementioned etching gas may be used.

After the aforementioned etching step, the mask removal step is performed. Namely, a residue of the etching mask is removed. A method for removing the residue of the etching mask may be determined as appropriate, depending on a material of the etching mask. For example, when the etching mask is made of a metal, the residue may be removed by using an acid solution or an alkaline solution having solubility with respect to the metal.

A sealant such as resin, glass and quartz may be formed on periodic recessed and projecting structure 21. A recessed and projecting structure may be further formed on a surface of the sealant. A configuration of the recessed and projecting structure may be similar to the configuration of periodic recessed and projecting structure 21 described above.

<Stacked Semiconductor Layer>

The stacked semiconductor layer is formed of a group-III nitride semiconductor and is formed by stacking n-type semiconductor layer 15, active layer 13 and p-type semiconductor layer 12 on substrate 16 in this order as shown in FIG. 1. The stacked semiconductor layer is stacked by using a method such as a metal organic chemical vapor deposition method (MOCVD method), a metal organic vapor phase epitaxy method (MOVPE method), a molecular beam epitaxy method (MBE method), and a hydride vapor phase epitaxy method (HYPE method).

N-type Semiconductor Layer:

N-type semiconductor layer 15 is a semiconductor layer made of $Al_xIn_yGaN_z$ (x, y and z are rational numbers satisfying $0<x\leq1.0$, $0\leq y\leq0.1$ and $0\leq z\leq1.0$, and $x+y+z=1.0$), and preferably includes an n-type impurity. The impurity is not particularly limited, and examples of the impurity include silicon (Si), germanium (Ge), tin (Sn) and the like, and the impurity is preferably Si or Ge. A concentration of the n-type impurity may be set to be not less than $1.0\times10^{17}/cm^3$ and not more than $1.0\times10^{20}/cm^3$. From the perspectives of the crystallinity and the contact property of n-type semiconductor layer 15, the concentration of the n-type impurity is preferably not less than $1.0\times10^{18}/cm^3$ and not more than $1.0\times10^{19}/cm^3$.

In addition, a layer thickness of n-type semiconductor layer 15 is not less than 100 nm and not more than 10000 nm. From the perspectives of the crystallinity and the conductivity of n-type semiconductor layer 15, the layer thickness of n-type semiconductor layer 15 is preferably not less than 500 nm and not more than 3000 nm.

Active Layer:

Active layer 13 has a multiquantum well structure. Active layer 13 has a stacked structure formed by alternately stacking a well layer made of $Al_xIn_yGaN_z$ (x, y and z are rational numbers satisfying $0<x\leq1.0$, $0\leq y\leq0.1$ and $0\leq z<1.0$, and $x+y+z=1.0$), and a barrier layer made of $Al_xIn_yGaN_z$ (x, y and z are rational numbers satisfying $0<x\leq1.0$, $0\leq y\leq0.1$ and $0\leq z<1.0$, and $x+y+z=1.0$) having a bandgap energy greather than that of the well layer. A layer thickness of the well layer is not less than 1 nm, and preferably not less than 2 nm. A layer thickness of the barrier layer is not less than 1 nm, and preferably not less than 2 nm.

P-type Semiconductor Layer:

P-type semiconductor layer 12 is formed of, for example, a p-type clad layer and a p-type contact layer. The p-type clad layer is made of $Al_xIn_yGaN_z$ (x, y and z are rational numbers satisfying $0<x\leq1.0$, $0\leq y\leq0.1$ and $0\leq z<1.0$, $x+y+z=1.0$). Since an electron needs to be confined within active layer 13, it is preferable that the p-type clad layer has a bandgap energy greater than that of the semiconductor layer forming active layer 13. Therefore, it is preferable that the Al composition of the p-type type clad layer is greater than the Al composition of the semiconductor layer forming active layer 13.

Examples of an impurity in the p-type clad layer suitably include magnesium (Mg). A concentration (doping concentration) of Mg is not less than $1.0\times10^{17}/cm^3$, and preferably not less than $1.0\times10^{17}/cm^3$. A layer thickness of the p-type clad layer is not less than 5 nm and not more than 1000 nm, and preferably not less than 10 nm and not more than 50 nm.

The p-type contact layer is made of $Al_xIn_yGaN_z$ (x, y and z are rational numbers satisfying $0<x\leq1.0$, $0\leq y\leq0.1$ and $0\leq z<1.0$, and $x+y+z=1.0$). It is preferable that the Al composition of the p-type contact layer is smaller than the Al composition of the p-type clad layer. A reason for this is that the excellent contact property is easily obtained when the bandgap energy of the p-type contact layer is smaller than that of the p-type clad layer. Similarly to the p-type clad layer, examples of an impurity in the p-type contact layer suitably include Mg. A doping concentration of Mg can be set to be not less than $1.0\times10^{17}/cm^3$. From the perspectives of the ultraviolet light transmission property and the contact property of the p-type contact layer, a layer thickness of the p-type contact layer is not less than 1 nm and not more than 50 nm, and preferably not less than 5 nm and not more than 30 nm.

<Negative Electrode Layer>

Negative electrode 14 is formed on an exposed surface (upper surface surrounding the projection of n-type semiconductor layer 15) of n-type semiconductor layer 15. The exposed surface of n-type semiconductor layer 15 is formed by partially removing a part of n-type semiconductor layer 15 as well as active layer 13 and p-type semiconductor layer 12 (e.g., by etching and the like). Dry etching such as reactive ion etching and inductively-coupled plasma etching can be suitably used as a method for etching. In order to remove a portion damaged by etching on the etched surface (exposed surface) of n-type semiconductor layer 15, after the exposed surface of n-type semiconductor layer 15 is formed, it is preferable to perform surface treatment with an acid or alkaline solution. Thereafter, negative electrode 14 having an ohmic property is formed on the aforementioned exposed surface of n-type semiconductor layer 15.

Patterning of the electrodes such as negative electrode 14 and positive electrode 11 can be performed by using the liftoff method. Specifically, a photoresist is applied onto the surface on which the electrode will be formed, and thereafter, the photoresist is partially irradiated with ultraviolet rays by using an UV exposure machine including a photomask. Thereafter, the photoresist is immersed in a developer to dissolve the exposed photoresist, and thereby, a resist film having a desired pattern is formed. A metal film that should form the electrode is deposited on the patterned resist film. Then, the resist film is dissolved by a stripping solution and the metal film located on the resist film is removed. In this manner, the metal film located in the region not having the resist film is left and the metal film (electrode) having a prescribed pattern is formed.

Examples of the method for patterning the electrode further include the following method. Specifically, a metal film that should form the electrode is formed on the electrode forming surface (e.g., exposed surface of n-type semiconductor layer 15). Then, a photoresist is applied onto the metal film, and thereafter, an exposing step and a developing step are performed to pattern the photoresist. Thereafter, by using the aforementioned patterned photoresist (resist film) as a mask, the metal film is partially removed by dry etching or wet etching. Thereafter, the photoresist is dissolved by a stripping solution. In this manner as well, the electrode can be formed. The aforementioned liftoff method is suitably used because the process thereof is simpler than that of the patterning method in which the resist pattern is formed on the metal film.

An arbitrary method such as a vacuum vapor deposition method, a sputtering method and a chemical vapor deposition method can be used as a method for depositing the metal film forming negative electrode 14. However, from the perspective of eliminating an impurity in the metal film, it is preferable to use the vacuum vapor deposition method. Although various materials can be used for negative electrode 14, a material of negative electrode 14 can be selected from the known materials. In order to enhance the contact property between n-type semiconductor layer 15 and negative electrode 14, it is preferable to perform heat treatment at a temperature of not less than 300° C. and not more than 1100° C. for a heating time of not less than 30 seconds and not more than 3 minutes, after the metal film that should form negative electrode 14 is deposited. As to the temperature and the heating time of heat treatment, heat treatment may be performed under optimum conditions as appropriate, depending on a type of the metal forming negative electrode 14 and a film thickness of the metal film.

<Positive Electrode Layer>

Positive electrode 11 is formed on the p-type contact layer in p-type semiconductor layer 12. Similarly to patterning of negative electrode 14, it is preferable to use the liftoff method for patterning of positive electrode 11. Although various metal materials can be used for positive electrode 11, a metal material of positive electrode 11 can be selected from the known materials. In addition, since it is preferable that positive electrode 11 has translucency, thinner positive electrode 11 is more preferable. Specifically, a thickness of positive electrode 11 is not more than 10 nm, and more suitably not more than 5 nm.

Similarly to formation of negative electrode 14, examples of a method for depositing a metal film that should form positive electrode 11 include the vacuum vapor deposition method, the sputtering method, the chemical vapor deposition method and the like. However, in order to eliminate an impurity in the metal film as much as possible, it is preferable to use the vacuum vapor deposition method. In order to enhance the contact property with the p-type contact layer, it is preferable to perform heat treatment at a temperature of not less than 200° C. and not more than 800° C. for a time of not less than 30 seconds and not more than 3 minutes, after the metal film that should form positive electrode 11 is deposited. As to the temperature and the time of heat treatment, a suitable condition can be selected as appropriate, depending on a type of the metal forming positive electrode 11 and a thickness of positive electrode 11.

Figure 5:
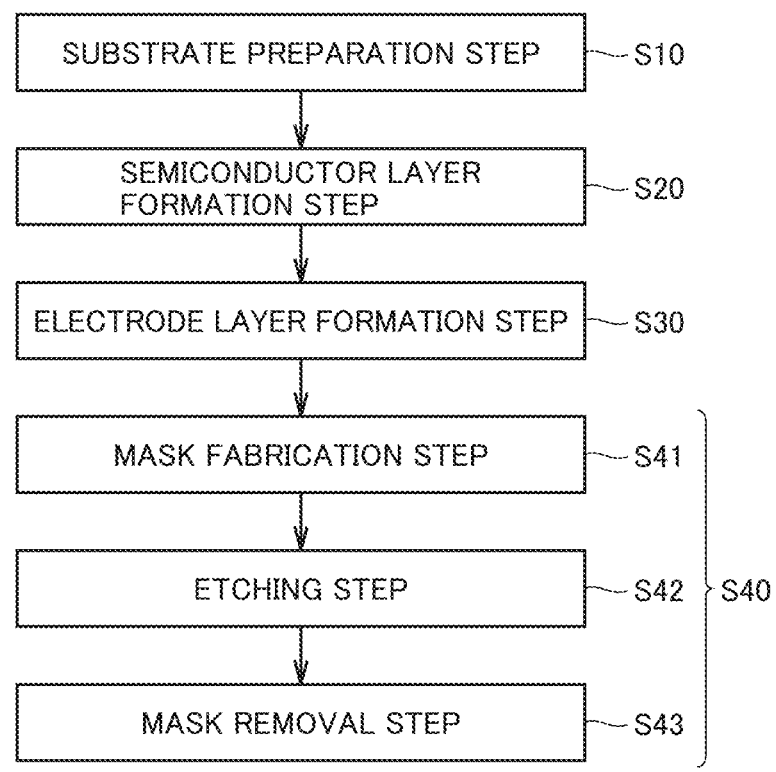
FIG. 5 is a flowchart for describing a method for manufacturing the semiconductor light emitting element shown in FIG. 1.

The aforementioned semiconductor light emitting element is manufactured by a manufacturing process shown in FIG. 5. Specifically, referring to FIG. 5, a substrate preparation step (S10) is first performed. In this step (S20), the substrate made of MN is prepared. It should be noted that in this stage, periodic recessed and projecting structure 21 is not yet formed on the rear surface of the substrate. Next, a semiconductor layer formation step (S20) is performed. In this step (S10), the stacked semiconductor layer formed of p-type semiconductor layer 12, active layer 13 and n-type semiconductor layer 15 is formed on the main surface of substrate 16. As described above, each of these p-type semiconductor layer 12, active layer 13 and n-type semiconductor layer 15 can be formed by an arbitrary method such as the MOCVD method and the MOVPE method.

Next, an electrode formation step (S30) is performed. In this step, a part of p-type semiconductor layer 12, active layer 13 and n-type semiconductor layer 15 is removed by etching, and thus, the exposed surface of n-type semiconductor layer 15 is formed as shown in FIG. 1. By using the liftoff method, positive electrode 11 is formed on p-type semiconductor layer 12 and negative electrode 14 is formed on the exposed surface of n-type semiconductor layer 15.

Thereafter, a recessed and projecting structure formation step (S40) is performed. In this step (S40), a mask formation step (S41) is first performed. In this step (S41), the etching mask pattern is formed on the rear surface of substrate 16 by using the lithography method as described above. Next, an etching step (S42) is performed. In this step (S42), etching is performed on the rear surface of substrate 16 by using the aforementioned etching mask pattern as a mask. As a result, periodic recessed and projecting structure 21 is formed. Next, a mask removal step (S43) is performed. In this step (S43), the residue of the etching mask is removed by an arbitrary method. In this manner, the semiconductor light emitting element shown in FIG. 1 can be obtained.

Second Embodiment

Figure 6:
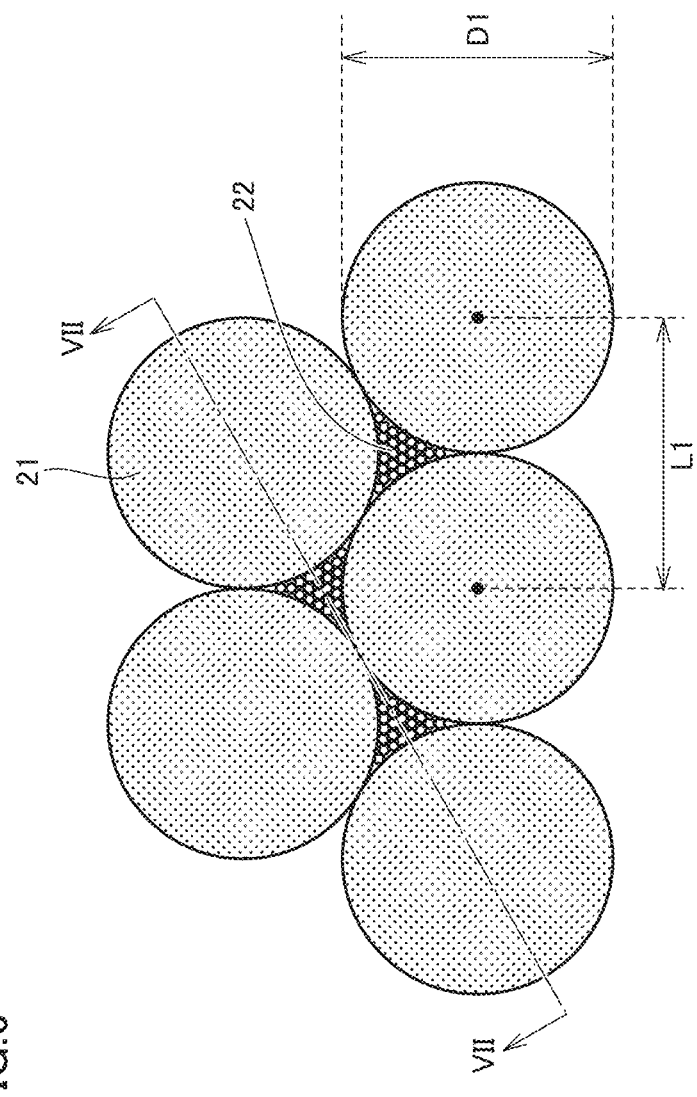
FIG. 6 is a schematic plan view for describing a second embodiment of the semiconductor light emitting element according to the present invention.

A semiconductor light emitting element according to a second embodiment of the present invention basically has a structure similar to that of the semiconductor light emitting element shown in FIGS. 1 to 3. However, the semiconductor light emitting element according to the second embodiment of the present invention is different from the semiconductor light emitting element shown in FIGS. 1 to 3, in terms of a configuration of the rear surface of substrate 16. FIG. 6 conceptually shows a planar structure of the rear surface of substrate 16 of the semiconductor light emitting element according to the second embodiment of the present invention. Referring to FIG. 6, in the semiconductor light emitting element according to the second embodiment of the present invention, the rear surface of substrate 16 is used as one example of the light extraction surface, and periodic recessed and projecting structure 21 is formed on the rear surface of substrate 16. A minute recessed and projecting structure 22 is further formed on a surface of periodic recessed and projecting structure 21.

Specifically, the semiconductor light emitting element shown in FIG. 6 is a semiconductor light emitting element comprising a semiconductor layer including active layer 13 serving as a light emitting layer, wherein a surface of the semiconductor light emitting element includes the rear surface of substrate 16 serving as the light extraction surface. At least one of the light extraction surface and an interface between two layers having different refractive indexes in the semiconductor light emitting element is provided with periodic recessed and projecting structure 21 having period L1 that exceeds 0.5 times as great as a wavelength of light emitted from active layer 13, and minute recessed and projecting structure 22 located on the surface of periodic recessed and projecting structure 21 and having an average diameter (average value of a diameter D2) that is not more than 0.5 times as great as the wavelength of the light. The average diameter can be determined by measuring each diameter of minute recessed and projecting structure 22 included in a square region with a side length being one period of periodic recessed and projecting structure 21, and obtaining an average value of the diameters.

Here, description is given to the case in which the rear surface of substrate 16 is used as one example of the light extraction surface and periodic recessed and projecting structure 21 and the like are formed on this rear surface 16A of substrate 16. However, the place where periodic recessed and projecting structure 21 and minute recessed and projecting structure 22 described above are formed is not limited to the light extraction surface. Namely, the place where periodic recessed and projecting structure 21 and minute recessed and projecting structure 22 are formed may be an interface between layers having different refractive indexes in the semiconductor light emitting element. For example, periodic recessed and projecting structure 21 and minute recessed and projecting structure 22 described above may be formed on an interface between rear surface 16A and a sealant (another member) when another member such as the sealant is formed on rear surface 16A of substrate 16, an interface between layers having different refractive indexes in the semiconductor layer or the like within the semiconductor light emitting element, or other places.

When another member such as the sealant is formed on the rear surface of substrate 16 as described above, a surface of this sealant (surface of another member) serves as the light extraction surface to the outside. In this case, periodic recessed and projecting structure 21 and minute recessed and projecting structure 22 described above may also be formed, for example, on the sealant surface portion serving as the light extraction surface, in addition to the interface having the largest difference in refractive index (e.g., interface between rear surface 16A and the sealant (another member)).

The semiconductor light emitting element according to the present embodiment is basically similar to the semiconductor light emitting element shown in FIGS. 1 to 3, in terms of the configurations of p-type semiconductor layer 12, active layer 13, n-type semiconductor layer 15, positive electrode 11, and negative electrode 14. As described above, however, the semiconductor light emitting element according to the present embodiment is different from the semiconductor light emitting element shown in FIGS. 1 to 3, in terms of the configuration of substrate 16. Therefore, the configuration of substrate 16 will be described below.

<Substrate>

Figure 7:
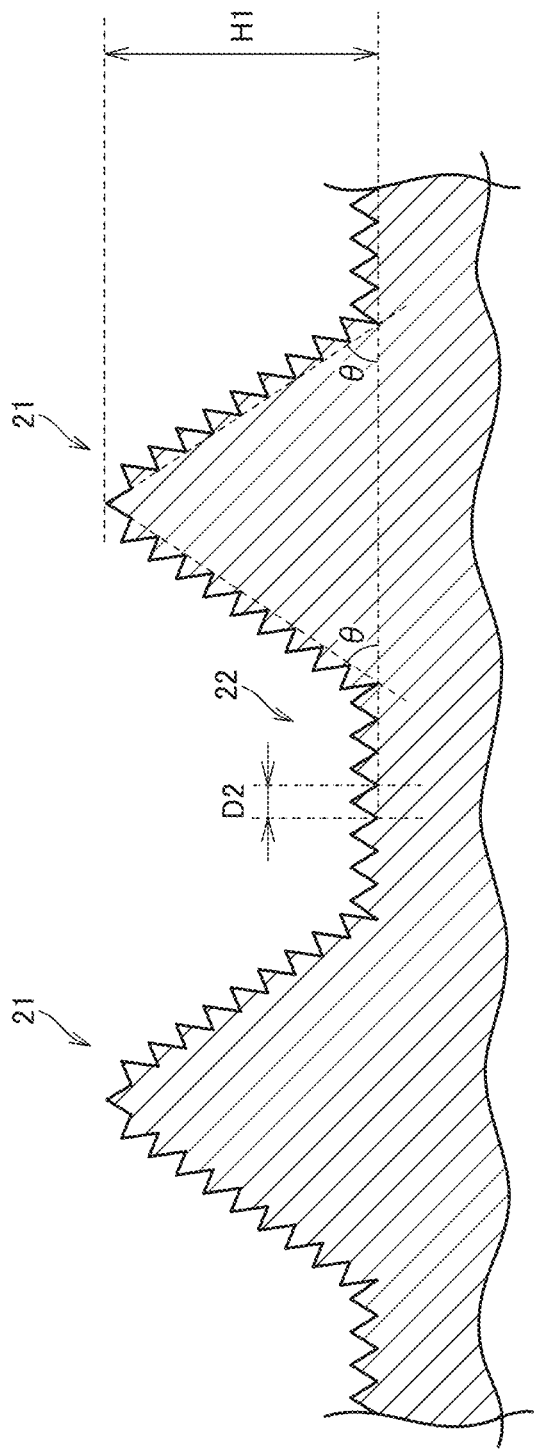
FIG. 7 is a schematic partial cross-sectional view taken along line VII-VII in FIG. 6.
Figure 8:
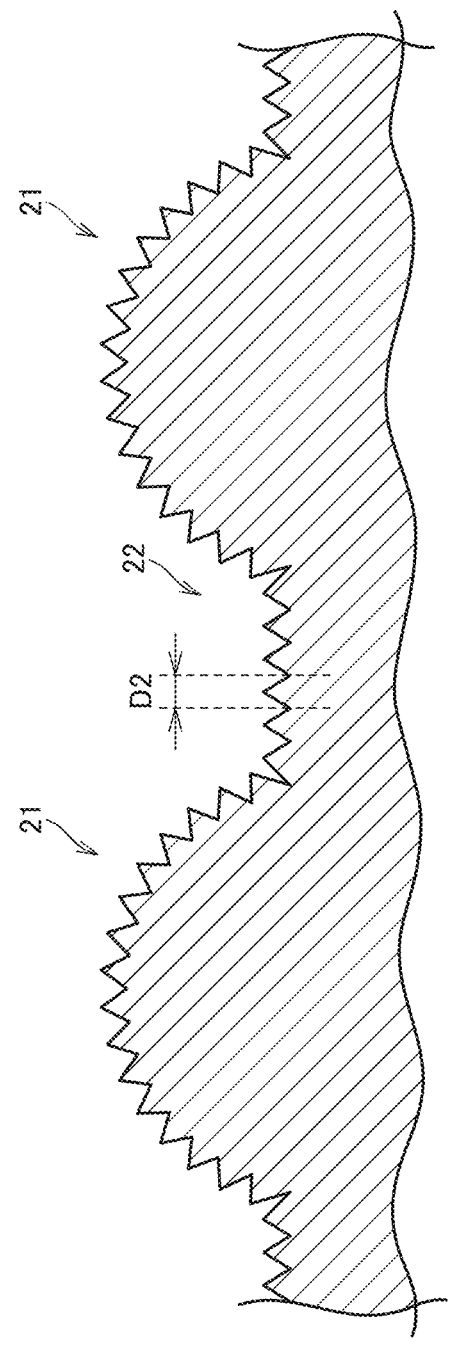
FIG. 8 is a schematic plan view for describing a modification of the semiconductor light emitting element shown in FIG. 6.

The material and the properties of substrate 16 are basically similar to those of substrate 16 in the semiconductor light emitting element shown in FIGS. 1 to 3, and sapphire, AlN, GaN and the like can, for example, be used. As described above, substrate 16 has periodic recessed and projecting structure 21 on the light extraction surface (rear surface). Specifically, periodic recessed and projecting structure 21 includes a projecting portion, and the projecting portion has a conical shape as shown in FIGS. 6 and 7. The projecting portion may have a semi-elliptical spherical shape as shown in FIG. 8.

Arrangement of periodic recessed and projecting structure 21 may be periodic arrangement such as triangular lattice arrangement, square lattice arrangement and hexagonal lattice arrangement, and is preferably triangular lattice arrangement that achieves the maximum filling factor. Furthermore, periodic recessed and projecting structure 21 may have period L1 that exceeds 0.5 times as great as the emission wavelength of the semiconductor light emitting element. In addition, it is preferable that a height of periodic recessed and projecting structure 21 (height H1 of the projecting portion) is within a range of not less than ⅓ times and not more than 5 times as great as period L1.

The numerical range of period L1 of periodic recessed and projecting structure 21 described above can be set to be, for example, not less than ⅔ times and not more than 1000 times, or not less than twice and not more than 100 times as great as the aforementioned emission wavelength. With such a configuration, the light extraction efficiency can be enhanced more reliably, and the manufacturing cost can be reduced, and more uniform element shape and light output can be obtained. In addition, height H1 of periodic recessed and projecting structure 21 is preferably not less than ½ times and not more than 3 times, and more preferably not less than ¾ times and not more than twice, as great as period L1. With such a configuration as well, the light extraction efficiency can be enhanced more reliably, and the manufacturing cost can be reduced, and more uniform element shape and light output can be obtained.

Furthermore, on the rear surface of substrate 16 having periodic recessed and projecting structure 21 formed thereon, minute recessed and projecting structure 22 smaller than periodic recessed and projecting structure 21 is formed on the surface of periodic recessed and projecting structure 21. Minute recessed and projecting structure 22 includes a minute projecting portion. Minute recessed and projecting structure 22 is arranged on a surface of the projecting portion of periodic recessed and projecting structure 21 and on a recessed portion (a flat portion located between the projecting portions) of periodic recessed and projecting structure 21. It is preferable that the average diameter of minute recessed and projecting structure 22 is not more than a half of the emission wavelength of the semiconductor light emitting element, and a height of minute recessed and projecting structure 22 is within a range of not less than 0.1 times and not more than 10 times as great as the average diameter. The height of minute recessed and projecting structure 22 is more preferably not less than 0.2 times and not more than 5 times, and further preferably not less than 0.5 times and not more than twice. It is preferable that the minute projecting portion of minute recessed and projecting structure 22 has a conical shape or a semi-elliptical spherical shape.

The average diameter of minute recessed and projecting structure 22 described above is more preferably not less than ¹⁄₃₀ times and not more than ⅖ times, and further preferably not less than ¹⁄₁₀ times and not more than ³⁄₁₀ times, as great as the aforementioned emission wavelength. With such a configuration, the light extraction efficiency can be enhanced more reliably. In addition, an average height of minute recessed and projecting structure 22 is preferably not less than 0.2 times and not more than 5 times, and more preferably not less than 0.5 times and not more than twice, as great as the average diameter. With such a configuration as well, the light extraction efficiency can be enhanced more reliably.

The average height of minute recessed and projecting structure 22 can be determined by measuring each height of the minute recessed and projecting structure included in a square region with a side length being one period of the periodic recessed and projecting structure, and obtaining an average value of the heights.

Next, a method for fabricating the recessed and projecting structure will be described below. Periodic recessed and projecting structure 21 and minute recessed and projecting structure 22 described above can be fabricated by a process including firstly an etching mask fabrication step (step (S410) in FIG. 9), secondly an etching step (step (S420) in FIG. 9), and thirdly an etching mask removal step (step (S430) in FIG. 9). The etching mask fabrication step is a step of fabricating an etching mask pattern on the substrate, and the electron beam lithography method, the optical lithography method, the nanoimprint lithography method and the like can be applied. Alternatively, in order to enhance an etching selectivity in the etching step, a metal mask pattern may be fabricated by forming a mask pattern (e.g., resist mask) having a pattern by the aforementioned arbitrary method, and then, depositing a metal to cover the mask pattern, and then, removing a part of the metal together with the mask pattern by the liftoff method.

In formation of minute recessed and projecting structure 22, it is preferable to form a metal mask by the liftoff method, and it is more preferable that the metal mask is formed of a nickel film. A reason for this is that a nickel particle etched in the etching step (S420) or a reactant of nickel and the etching gas adheres to the rear surface of substrate 16 again and acts as a nanosized etching mask, and thus, minute recessed and projecting structure 22 can be reliably formed.

By using the mask pattern as the etching mask, the rear surface of substrate 16 is etched to form a desired pattern on the rear surface of substrate 16. Dry etching such as inductively-coupled plasma (ICP) etching and reactive ion etching (RIE), wet etching using an acid solution or an alkaline solution as an etchant, or the like can be applied as a method for etching. In order to form a highly periodic pattern, it is preferable to apply dry etching.

In the etching step using dry etching, a resin material such as a resist or a metal can be used as the etching mask. Furthermore, a reactive gas, preferably a chlorine-based gas, a fluorine-based gas, a bromine-based gas, or a gas obtained by mixing hydrogen, oxygen, argon or the like with the etching gas can be used as the etching gas. In order to form minute recessed and projecting structure 22, it is preferable to use a fluorine-based gas, particularly a carbon-containing fluorine-based gas as the gas for dry etching.

Alternatively, prior to the aforementioned mask fabrication step, the rear surface of substrate 16 may be preliminarily roughened by dry etching or wet etching. In this case, periodic recessed and projecting structure 21 is formed on this roughened surface by the aforementioned process, and thus, a combination of periodic recessed and projecting structure 21 and minute recessed and projecting structure 22 can be fabricated.

Alternatively, after periodic recessed and projecting structure 21 is formed, a fine particle of metal or ceramics may be arranged on the rear surface (surface having periodic recessed and projecting structure 21 formed thereon) of substrate 16 and dry etching may be performed by using the fine particle as the etching mask. In this manner as well, the combination of periodic recessed and projecting structure 21 and minute recessed and projecting structure 22 can be fabricated. Examples of a method for arranging the aforementioned fine particle include a method for applying a solvent having the fine particle dissolved therein onto the rear surface of substrate 16 and drying the solvent, a method for forming a metal thin film on the rear surface of substrate 16 and then heating the metal thin film and flocculating a metal of the metal thin film, and other methods. However, any of these methods may be used.

As described above, there are various fabrication methods for allowing periodic recessed and projecting structure 21 and minute recessed and projecting structure 22 to coexist. However, considering the simplicity of the process and the like, the method for etching the metal mask by the carbon-containing fluorine-based gas is the most preferable.

After the etching step, a residue of the etching mask is removed as the mask removal step. The method described in the first embodiment can be used as a method for removing the residue of the etching mask.

A sealing portion such as resin, glass and quartz may be formed on the combination of periodic recessed and projecting structure 21 and minute recessed and projecting structure 22. Furthermore, the combination of periodic recessed and projecting structure 21 and minute recessed and projecting structure 22, or periodic recessed and projecting structure 21 or minute recessed and projecting structure 22 may be formed on a surface of the sealing portion.

Figure 9:
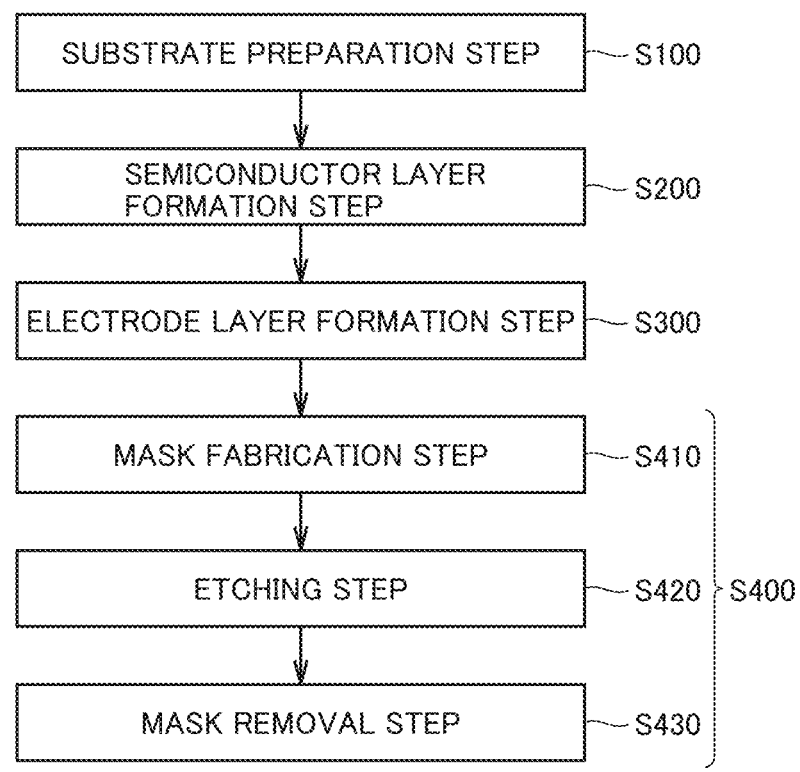
FIG. 9 is a flowchart for describing a method for manufacturing the semiconductor light emitting element shown in FIG. 6.

The aforementioned semiconductor light emitting element according to the present embodiment is manufactured by a manufacturing process shown in FIG. 9. Specifically, referring to FIG. 9, a substrate preparation step (S100) to an electrode formation step (S300) are performed. These steps (S100) to (S300) can be performed basically similarly to the steps (S10) to (S30) shown in FIG. 5.

Thereafter, a recessed and projecting structure formation step (S400) is performed. In this step (S400), a mask formation step (S410) is first performed. In this step (S410), an etching mask pattern made of metal is formed on the rear surface of substrate 16 by using the lithography method and the like as described above. Next, an etching step (S420) is performed. In this step (S420), by using the aforementioned etching mask pattern as a mask, etching is performed on the rear surface of substrate 16 with the carbon-containing fluorine-based gas. As a result, periodic recessed and projecting structure 21 and minute recessed and projecting structure 22 are formed. Next, a mask removal step (S430) is performed. In this step (S430), a residue of the etching mask is removed by an arbitrary method. In this manner, the semiconductor light emitting element shown in FIG. 6 can be obtained.

Periodic recessed and projecting structure 21 and minute recessed and projecting structure 22 described above may be formed on an interface between two layers having different refractive indexes in the semiconductor light emitting element, not on the rear surface of substrate 16. In this case as well, a ratio of reflection and total reflection, from this interface, of the light emitted from the light emitting layer can be reduced, and as a result, the light extraction efficiency of the semiconductor light emitting element can be enhanced.

Hereinafter, the characteristic configuration of the present invention will be described, some of which may duplicate those described in the above embodiments.

Specifically, one aspect of the present invention is characterized in that periodic recessed and projecting structure 21 having a period that exceeds 0.5 times as great as an emission wavelength and minute recessed and projecting structure 22 having an average diameter that is not more than a half of the emission wavelength are formed together on the same surface of the semiconductor light emitting element (such as rear surface 16A of substrate 16 which is one example of the light extraction surface, or the surface of another member when another member such as the sealant is arranged on rear surface 16A of substrate 16) or on the same interface between layers having different refractive indexes in the semiconductor light emitting element (such as, for example, an interface between rear surface 16A and a resin when the resin or the like is arranged on rear surface 16A of substrate 16, or the interface between the layers having different refractive indexes in the semiconductor layer or the like within the semiconductor light emitting element).

In this case, minute recessed and projecting structure 22 smaller than the periodic recessed and projecting structure is formed on the flat surface portion located between periodic recessed and projecting structures 21 and on the surface of periodic recessed and projecting structure 21. Therefore, as compared with the case in which periodic recessed and projecting structure 21 is present alone, a difference in refractive index at the surface or the interface can be further mitigated, and reflection and total reflection can be suppressed.

In the case of periodic recessed and projecting structure 21 alone, it is normally necessary to form small-scale periodic recessed and projecting structure 21 that is approximately equal to or smaller than the wavelength, in order to enhance the light extraction efficiency. However, in the structure according to the present embodiment, even if periodic recessed and projecting structure 21 has a size larger than the wavelength, the light extraction efficiency can be sufficiently enhanced by combining periodic recessed and projecting structure 21 with minute recessed and projecting structure 22. Namely, even if the emission wavelength is short, the cost required to fabricate the light extraction structure is reduced, and fabrication of the uniform structure becomes easy because a process window is widened.

Furthermore, it is preferable that an arrangement pattern of periodic recessed and projecting structure 21 is a triangular lattice-like pattern.

Furthermore, as for the shape of periodic recessed and projecting structure 21, it is preferable that a cross-sectional area of a high refractive index medium decreases from the bottom toward the vertex direction (light extraction direction).

Furthermore, it is preferable that periodic recessed and projecting structure 21 has a projecting shape and the projecting shape is conical or semi-elliptical spherical.

The present invention is not limited to the following, while one aspect of the present invention has the following characteristics.

One aspect of the present invention is characterized by including a stacked semiconductor structure having an n-type group-III nitride semiconductor layer (n-type semiconductor layer 15), a group-III nitride semiconductor light emitting layer (active layer 13) and a p-type group-III nitride semiconductor layer (p-type semiconductor layer 12).

One aspect of the present invention is characterized by including a transparent substrate (substrate 16) having a flip chip structure and having transparency to the emission wavelength on the light extraction surface side as seen from the group-III nitride semiconductor light emitting layer.

One aspect of the present invention is characterized in that the transparent substrate is an aluminum nitride (AlN) substrate or a sapphire substrate.

One aspect of the present invention is characterized in that the emission wavelength is equal to or shorter than 450 nm, or equal to or shorter than 350 nm.

One aspect of the present invention is characterized in that a height of periodic recessed and projecting structure 21 is within a range of ⅓ times to 5 times as great as the period, and an average height of minute recessed and projecting structure 22 is within a range of 1/10 times to 5 times as great as the average diameter.

Another aspect of the present invention is characterized by including a stacked semiconductor structure having an AlN substrate (substrate 16), an n-type group-III nitride semiconductor layer (n-type semiconductor layer 15), a group-III nitride semiconductor light emitting layer (active layer 13), and a p-type group-III nitride semiconductor layer (p-type semiconductor layer 12), wherein an emission wavelength is equal to or shorter than 350 nm, and periodic recessed and projecting structure 21 having a period that is within a range of ⅓ times to 5 times as great as the emission wavelength/(a difference between a refractive index of the AlN substrate and a refractive index of an external medium) is formed on a surface of the AlN substrate.

Furthermore, it is preferable that an arrangement pattern of periodic recessed and projecting structure 21 is a triangular lattice-like pattern.

Furthermore, it is preferable that periodic recessed and projecting structure 21 has a projecting shape and the projecting shape is conical or semi-elliptical spherical. Furthermore, it is preferable that a height of periodic recessed and projecting structure 21 is within a range of ⅓ times to 5 times as great as the period.

Still another aspect of the present invention is a method for manufacturing the aforementioned semiconductor light emitting element, characterized by including the steps of: periodically processing an organic thin film; forming a metal mask by using the organic film (organic thin film); and forming periodic recessed and projecting structure 21 by a dry etching method by using the mask.

Furthermore, still another aspect of the present invention is characterized by including the step of simultaneously forming periodic recessed and projecting structure 21 and minute recessed and projecting structure 22 by the dry etching method using the metal mask and a fluorine-based gas.

In this case, by the dry etching method using the metal mask and the fluorine-based gas, the periodic recessed and projecting structure can be artificially fabricated with uniformity and a high degree of accuracy. In addition, by acid treatment for stripping the metal mask after dry etching, minute recessed and projecting structure 22 sufficiently smaller than the wavelength is spontaneously formed on the flat surface portion located between the periodic recessed and projecting structures and on the surface of periodic recessed and projecting structure 21. Therefore, periodic recessed and projecting structure 21 and minute recessed and projecting structure 22 can be simultaneously formed in one process. Therefore, periodic recessed and projecting structure 21, which is as great as or greater than the wavelength and whose shape change affects the properties greatly, can be fabricated with uniformity and a high degree of accuracy, while minute recessed and projecting structure 22, which is sufficiently smaller than the wavelength and whose shape change does not affect the properties greatly, can be formed spontaneously and densely. In addition, periodic recessed and projecting structure 21 and minute recessed and projecting structure 22 are characterized by being made of the same material. As a result, the uniformity of the processed shape and the reproducibility of the process can be enhanced, and the light extraction efficiency and the uniformity thereof can be enhanced, and further, the manufacturing cost can be lowered.

According to the present invention, by combining periodic recessed and projecting structure 21 and minute recessed and projecting structure 22 having different scales, reflection and total reflection from the substrate surface (light extraction surface) or the interface are effectively suppressed. In addition, since the process window is widened, the semiconductor light emitting element that achieves high light extraction efficiency and uniform light output can be fabricated with high reproducibility and high productivity, even if the emission wavelength is short. Furthermore, according to the present invention, due to the manufacturing method in which periodic recessed and projecting structure 21 and minute recessed and projecting structure 22 are simultaneously fabricated, the uniformity of the processed shape and the reproducibility of the process can be enhanced, and the light extraction efficiency and the uniformity thereof can be enhanced, and further, the manufacturing cost can be lowered.

EXAMPLE 1

Figure 10:
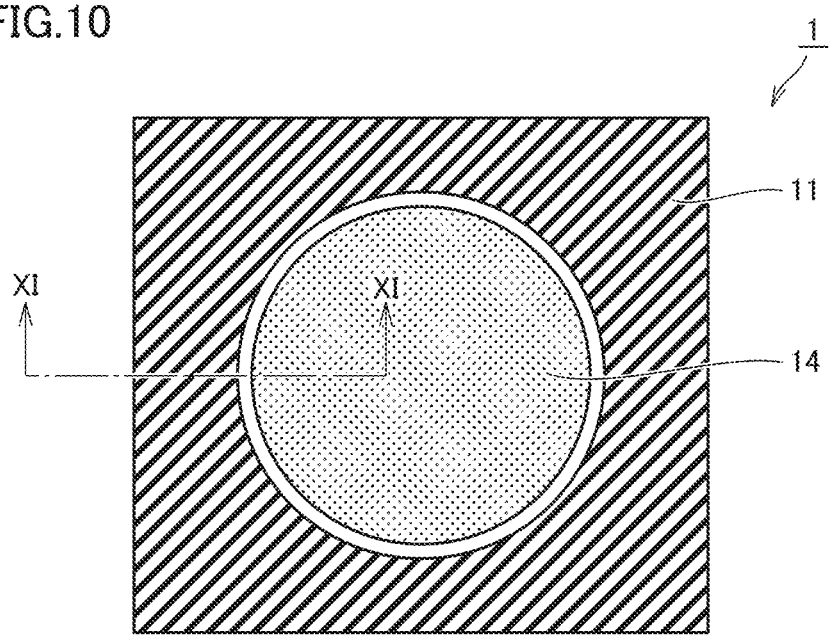
FIG. 10 is a schematic plan view of a semiconductor light emitting element used as a sample of Example 1.
Figure 11:
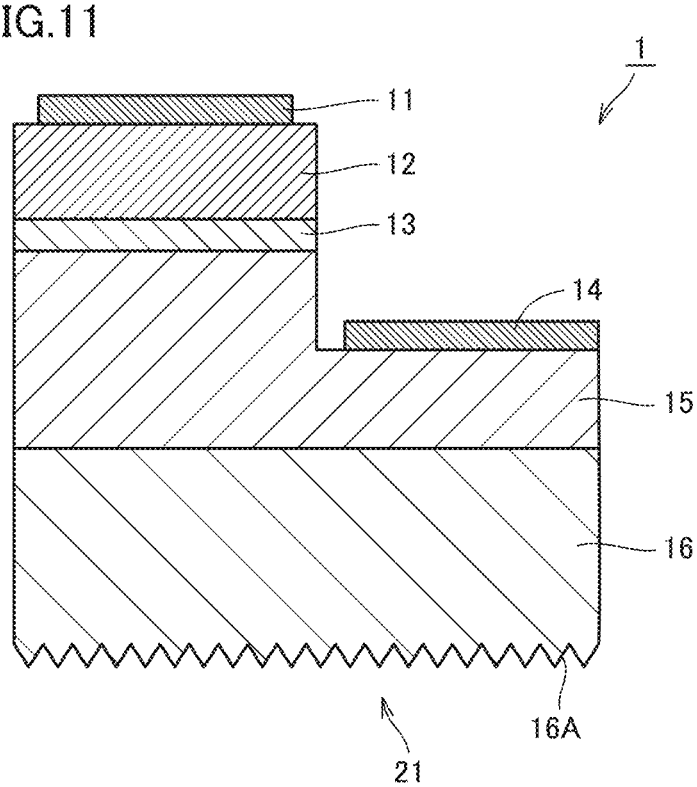
FIG. 11 is a schematic cross-sectional view taken along line XI-XI in FIG. 10.

Based on the structure of the semiconductor light emitting element according to the aforementioned embodiment of the present invention, a semiconductor light emitting element according to Example 1 was fabricated as shown in FIGS. 10 and 11. Specifically, n-type semiconductor layer 15, active layer 13 (light emitting layer) and p-type semiconductor layer 12 were sequentially grown on substrate 16 made of single-crystal MN by the MOCVD method to form a light emitting element substrate, and positive electrode 11 and negative electrode 14 were arranged at prescribed positions of the light emitting element substrate. An epitaxial layer including the light emitting layer of the semiconductor light emitting element was formed of an AlGaN-based semiconductor similar to that in the aforementioned embodiment, and an emission wavelength of the element was 265 nm.

An electron beam resist was applied onto a substrate surface (light extraction surface) of the fabricated semiconductor light emitting element substrate opposite to the epitaxial layer, and alignment was performed to cover a light emitting portion of the semiconductor light emitting element, and electron beam lithography was performed to fabricate an etching mask pattern. The light emitting portion was a circular region having a diameter of 100 μm, and a lithography region was 900 μm×900 μm, with a center of the light emitting portion being a center of lithography. A lithography pattern was set to have a diameter of 220 nm, a pattern period of 300 nm, and triangular lattice pattern arrangement. Next, nickel was deposited in a thickness of 100 nm to 500 nm on the etching mask pattern by the vacuum vapor deposition method. As described in the aforementioned embodiment, a reason why nickel was deposited was to enhance the etching selectivity of substrate 16 and the etching mask pattern. After nickel was deposited, the semiconductor light emitting element substrate was immersed in a stripping solution for the electron beam resist, and the resist and nickel located on this resist were removed (liftoff method). In this manner, a mask pattern made of nickel was formed on the rear surface of substrate 16.

Then, the aforementioned semiconductor light emitting element substrate was introduced into an ICP etching apparatus, and etching treatment was performed for 10 to 30 minutes by using a trifluoromethane ($CHF_3$) gas. Thereafter, in order to remove the mask pattern made of nickel, the semiconductor light emitting element substrate was immersed for 15 minutes in hydrochloric acid having a temperature of 20° C. to 30° C. At this time, in order to prevent the electrode metal of the semiconductor light emitting element substrate from becoming eroded by hydrochloric acid, a photoresist was preliminarily applied onto the surface of the semiconductor light emitting element substrate having the electrodes formed thereon, and was cured and used as a protective film. After immersion in hydrochloric acid, the semiconductor light emitting element substrate was rinsed with ultrapure water, and the photoresist serving as a protective film was dissolved by the stripping solution.

Figure 12:
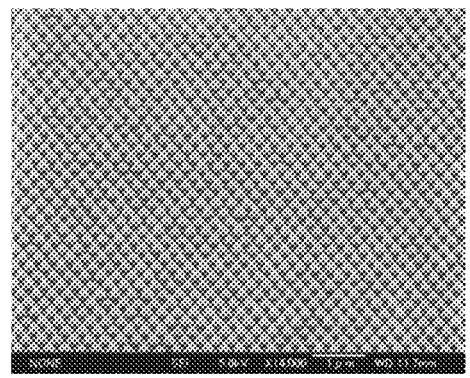
FIG. 12 is a scanning electron microscope photograph of a light extraction surface of the semiconductor light emitting element shown in FIG. 10.
Figure 13:
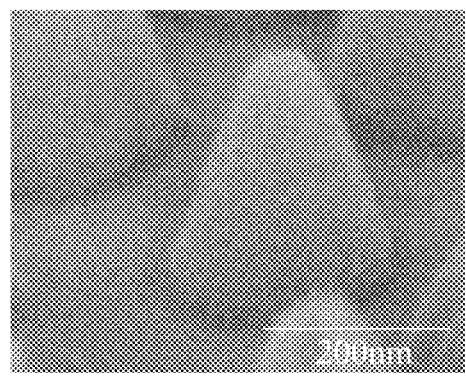
FIG. 13 is a scanning electron microscope photograph of the light extraction surface of the semiconductor light emitting element shown in FIG. 10.

In this manner, the ultraviolet-light-emitting semiconductor light emitting element of Example 1 including substrate 16 having a conical structure having a conical bottom diameter of 250 nm, period L1 of 300 nm and height H1 of 250 nm was fabricated. SEM photographs of the fabricated recessed and projecting structure are shown in FIGS. 12 and 13.

As a comparative example with respect to Example 1, an ultraviolet-light-emitting semiconductor light emitting element before forming the recessed and projecting structure on substrate 16 was prepared (Comparative Example 1). Then, the light output of the samples of these Example and Comparative Example 1 was measured. The result is shown in FIG. 14.

Figure 14:
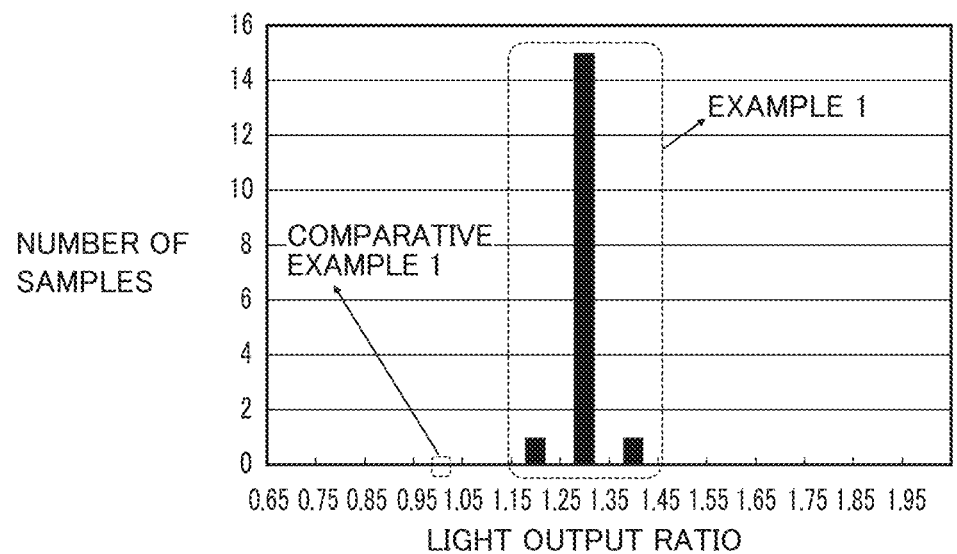
FIG. 14 is a graph showing an experimental result in Example 1.

Referring to FIG. 14, the horizontal axis represents the light output ratio in the Example with respect to Comparative Example 1, and the vertical axis represents the number of samples. Assuming that the light output in Comparative Example 1 was 1.00, an average value of the light output ratio in the Example was 1.31. FIG. 14 is a histogram showing the light output ratio of the ultraviolet-light-emitting semiconductor light emitting element which is the sample of Example 1. In addition, a standard deviation of the light output ratio in Example 1 was 0.031, which corresponded to 2.3% of the average value of the light output ratio. Namely, the sample of Example 1 was proved to be a semiconductor light emitting element having extremely small variations in light emission output.

EXAMPLE 2

Based on the structure of the semiconductor light emitting element according to the aforementioned embodiment of the present invention, a semiconductor light emitting element according to Example 2 was fabricated. The configuration of the semiconductor light emitting element according to Example 2 was basically similar to that of the semiconductor light emitting element according to Example 1. Specifically, n-type semiconductor layer 15, active layer 13 (light emitting layer) and p-type semiconductor layer 12 were sequentially grown on substrate 16 made of single-crystal MN by the MOCVD method to form a light emitting element substrate, and positive electrode 11 and negative electrode 14 were arranged at prescribed positions of the light emitting element substrate. An epitaxial layer including the light emitting layer of the semiconductor light emitting element was formed of an AlGaN-based semiconductor similar to that in the aforementioned embodiment, and an emission wavelength of the element was 265 nm.

An electron beam resist was applied onto a substrate surface (light extraction surface) of the fabricated semiconductor light emitting element wafer opposite to the light emitting element layer, and alignment was performed to cover a light emitting portion of the semiconductor light emitting element, and electron beam lithography was performed to fabricate an etching mask pattern. The light emitting portion was a circular region having a diameter of 100 μm, and a lithography region was 900 μm×900 μm, with a center of the light emitting portion being a center of lithography. A lithography pattern was set to have a diameter of 300 nm, a pattern period of 600 nm, and equilateral-triangular lattice pattern arrangement. Next, nickel was deposited in a thickness of 100 nm to 500 nm on the mask pattern by the vacuum vapor deposition method. A reason why nickel was deposited was similar to the reason described in Example 1. After nickel was deposited, the semiconductor light emitting element substrate was immersed in a stripping solution for the electron beam resist, and the resist and nickel located on this resist were removed (liftoff method). In this manner, a mask pattern made of nickel was formed on the rear surface of substrate 16.

Then, the aforementioned semiconductor light emitting element substrate was introduced into an ICP etching apparatus, and etching treatment was performed for 30 to 80 minutes by using a trifluoromethane ($CHF_3$) gas. By adjusting the nickel film thickness and the etching time, the presence or absence of development of a minute recessed and projecting structure and the shape thereof were controlled. Finally, in order to remove the mask pattern made of nickel, the semiconductor light emitting element substrate was immersed for 15 minutes in hydrochloric acid heated to a temperature of 60° C. to 90° C. At this time, in order to prevent the electrode metal of the semiconductor light emitting element substrate from becoming eroded by hydrochloric acid, a photoresist was preliminarily applied onto the surface of the semiconductor light emitting element substrate having the electrodes formed thereon, and was cured and used as a protective film. After immersion in hydrochloric acid, the semiconductor light emitting element substrate was rinsed with ultrapure water, and the photoresist used as a protective film was dissolved by the stripping solution.

Figure 15:
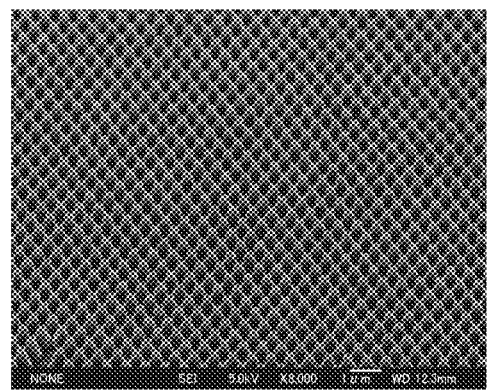
FIG. 15 is a scanning electron microscope photograph of a light extraction surface of a semiconductor light emitting element used as a sample of Example 2.
Figure 16:
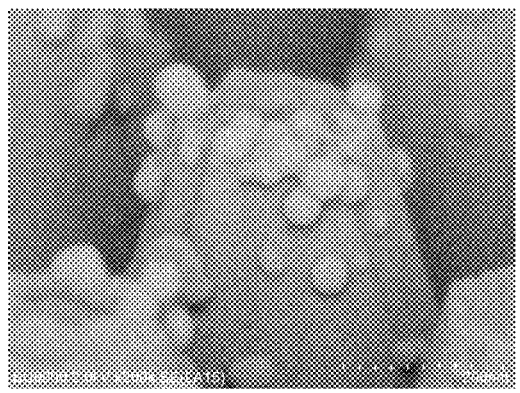
FIG. 16 is a scanning electron microscope photograph of the light extraction surface of the semiconductor light emitting element used as the sample of Example 2.
Figure 17:
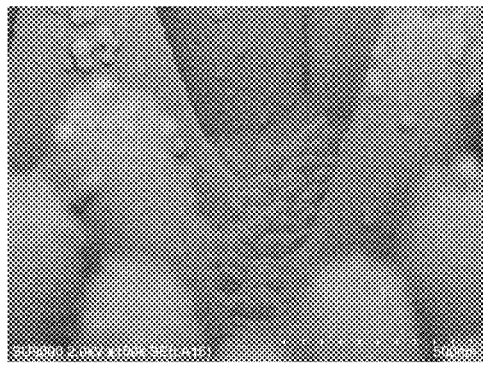
FIG. 17 is a scanning electron microscope photograph of the light extraction surface of the semiconductor light emitting element used as the sample of Example 2.

In this manner, the ultraviolet-light-emitting semiconductor light emitting element of Example 2 including the substrate having the periodic recessed and projecting structure having a conical bottom diameter of 600 nm, a period of 600 nm and a height of 550 nm and the minute recessed and projecting structure having an average diameter of 52 nm and an average height of 52 nm was fabricated. SEM photographs of the fabricated recessed and projecting structure are shown in FIGS. 15 to 17.

As a comparative example with respect to Example 2, an ultraviolet-light-emitting semiconductor light emitting element before forming the recessed and projecting structure on the substrate was prepared (Comparative Example 2). Then, the light output of these samples of Example 2 and Comparative Example 2 was measured. The result is shown in FIG. 18.

Figure 18:
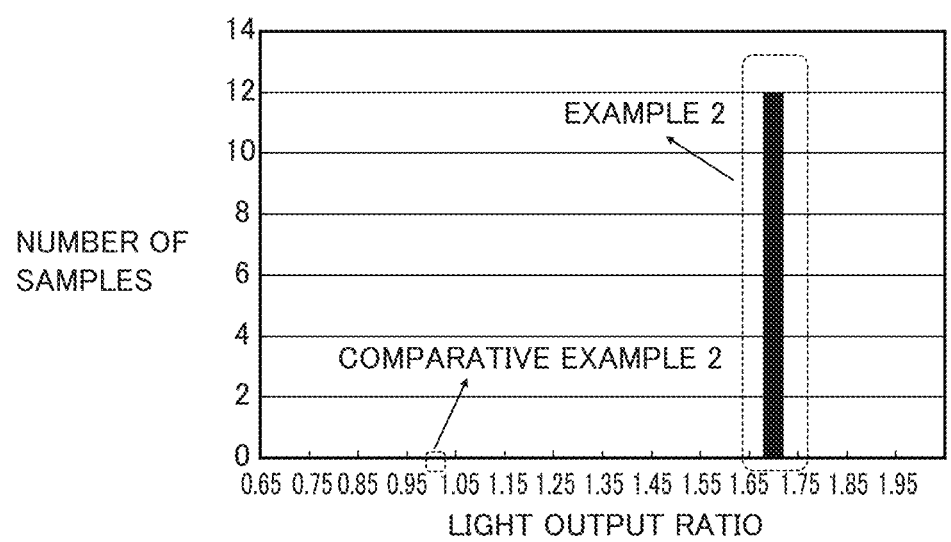
FIG. 18 is a graph showing an experimental result in Example 2.

Referring to FIG. 18, the horizontal axis represents the light output ratio in Example 2 with respect to Comparative Example 2, and the vertical axis represents the number of samples. Assuming that the light output in Comparative Example 2 was 1.00, an average value of the light output ratio in Example 2 was 1.70. Assuming that an ultraviolet-light-emitting semiconductor light emitting element having only the minute recessed and projecting structure was Comparative Example 3, an average value of the light output ratio in Comparative Example 3 with respect to Comparative Example 2 was 1.25. As a result, the superiority of the structure having both the periodic recessed and projecting structure and the minute recessed and projecting structure fabricated in Example 2 could be proved. FIG. 18 is a histogram showing the light output ratio of the ultraviolet-light-emitting semiconductor light emitting element which is the sample of Example 2. In addition, a standard deviation of the light output ratio in Example 2 was 0.029, which corresponded to 1.7% of the average value of the light output ratio in Example 2. Namely, the sample of Example 2 was also proved to be a semiconductor light emitting element having extremely small variations in light emission output.

EXAMPLE 3

In order to check the effect of periodic recessed and projecting structure 21 formed in the semiconductor light emitting element according to the present invention, simulation calculation described below was performed. Specifically, calculation was performed of the light extraction efficiency at which the light (wavelength: 265 nm) emitted from the AlGaN layer serving as the light emitting layer was extracted to the outside (air) through the AlN substrate and the periodic recessed and projecting structure (conical two-dimensional periodic arrangement (triangular lattice) made of AlN) processed on the surface of the AlN substrate. Calculation was also performed of the light extraction efficiency when there is no periodic recessed and projecting structure in the similar system.

The finite-difference time-domain method (FDTD method) was used for calculation and a dipole point light source was set as an initial light source. Oscillation directions and positions of the dipole were changed, and calculation and averaging (pseudo randomization) were performed to artificially reproduce a non-coherent light source. A refractive index of the AlGaN portion was assumed as 2.43, a refractive index of the AlN portion was assumed as 2.29, and a refractive index of the air portion was assumed as 1.0. The side (rear surface side) opposite to the light extraction surface as seen from the light emitting layer was an absorbing boundary because the light is normally absorbed by the p-GaN layer. The results are shown in FIGS. 19 and 20.

Figure 19:
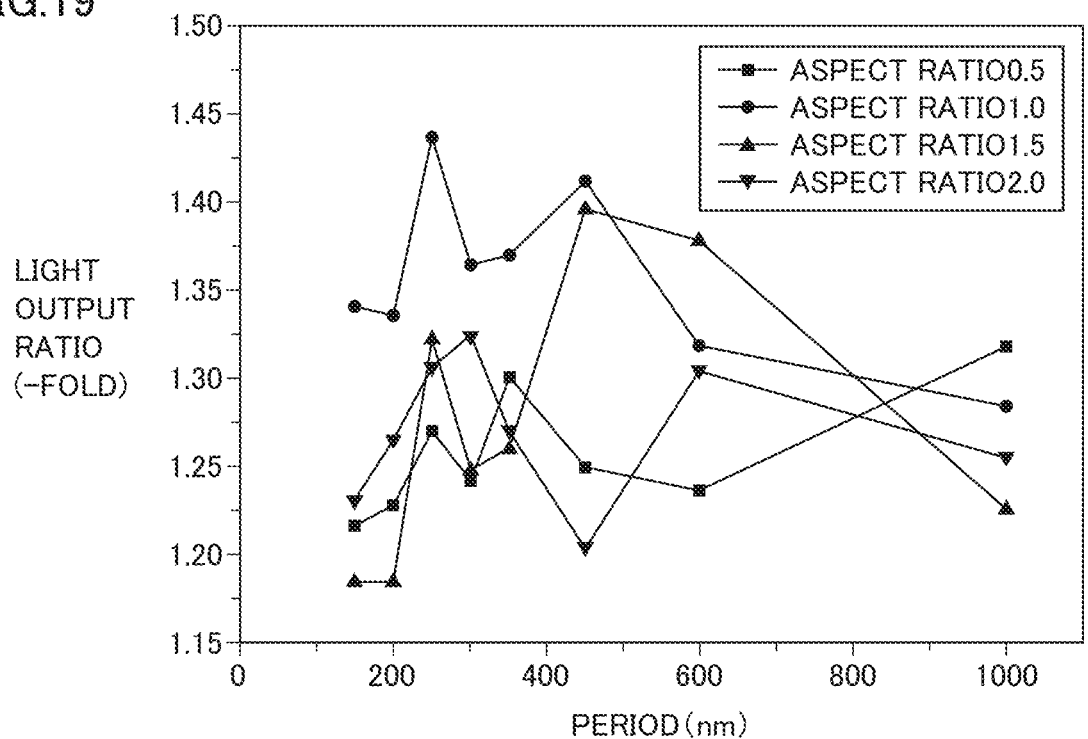
FIG. 19 is a graph showing a simulation calculation result in Example 3.
Figure 20:
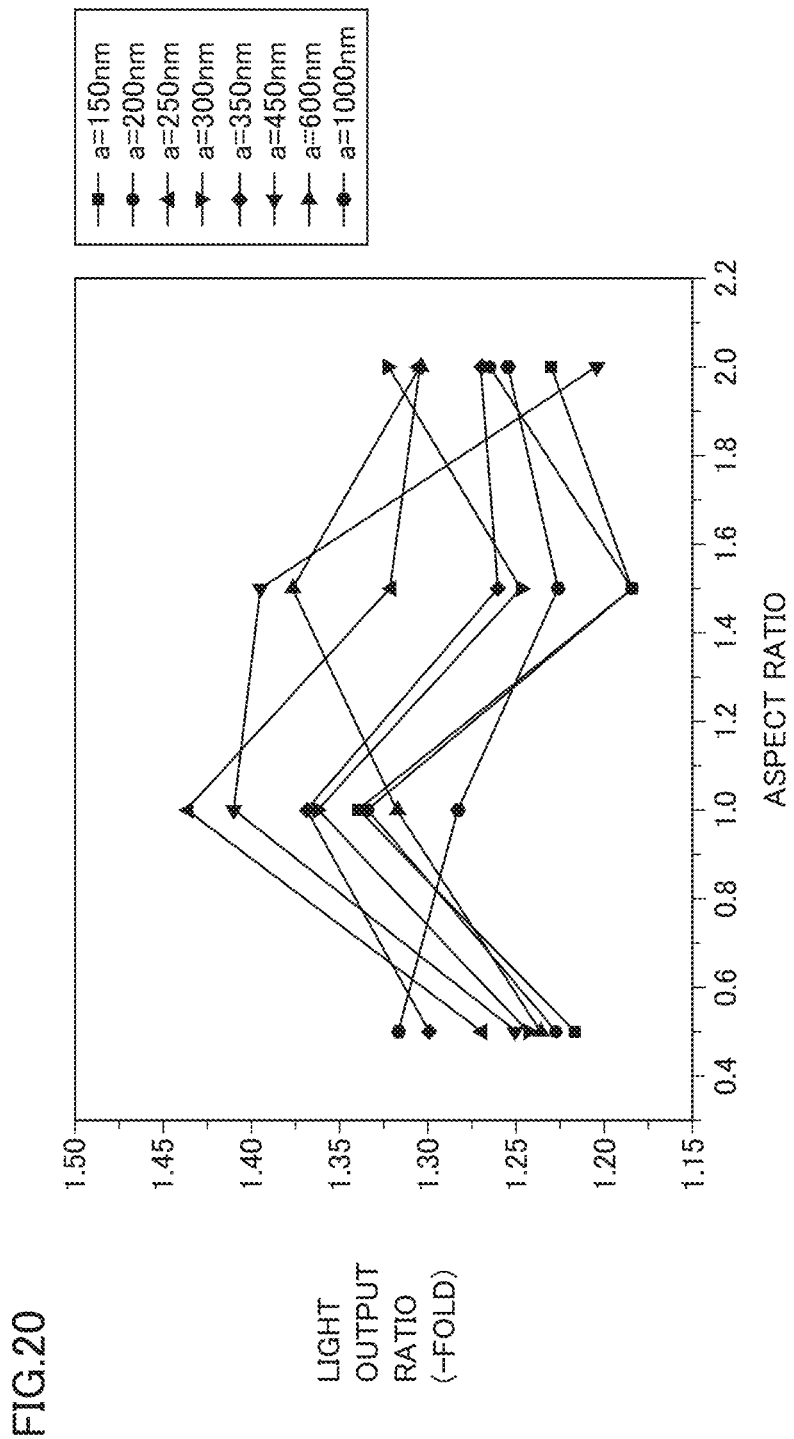
FIG. 20 is a graph showing a simulation calculation result in Example 3.

FIGS. 19 and 20 show numerical values (light output ratio) obtained by calculating the light extraction efficiency at which the light (wavelength: 265 nm) emitted from the AlGaN layer serving as the light emitting layer is extracted to the outside (air) through the AlN substrate and the periodic recessed and projecting structure (conical two-dimensional periodic arrangement (triangular lattice) made of AlN) processed on the surface of the AlN substrate, and standardizing this light extraction efficiency with the result when there is no periodic recessed and projecting structure (flat surface). A width of the bottom of the projecting portion (conical portion) of the periodic recessed and projecting structure was matched with the period. In FIG. 19, the horizontal axis represents the period (unit: nm) of the periodic recessed and projecting structure, and the vertical axis represents the light output ratio. In FIG. 19, data is shown for each of different aspect ratios. In FIG. 20, the horizontal axis represents the aspect ratio (a ratio of a height of the projecting portion to the width of the bottom of the projecting portion (conical portion) of the periodic recessed and projecting structure), and the vertical axis represents the light output ratio. In FIG. 20, data is shown for each period (a) of the periodic recessed and projecting structure.

Referring to FIG. 19, in the period range of 200 nm to 450 nm, the light output ratio is the highest when the aspect ratio is 1.0. Referring to FIG. 20, the light output ratio is the highest when the aspect ratio is 1.0.

FIGS. 19 and 20 show the results of calculation in two dimensions. However, it has been confirmed that the results showing a similar tendency to that of calculation in three dimensions are obtained.

EXAMPLE 4

In order to check the effect of periodic recessed and projecting structure 21 formed in the semiconductor light emitting element according to the present invention, simulation calculation described below was performed. Specifically, calculation was performed of the light extraction efficiency at which the light (wavelength: 265 nm) emitted from the AlGaN layer serving as the light emitting layer was extracted to the outside (sealant layer) through the AlN substrate and the periodic recessed and projecting structure (conical two-dimensional periodic arrangement (triangular lattice) made of AlN) processed on the surface of the AlN substrate. Calculation was also performed of the light extraction efficiency when there is no periodic recessed and projecting structure in the similar system. The calculation method was similar to that in Example 3. A refractive index of the AlGaN portion was assumed as 2.43, a refractive index of the AlN portion was assumed as 2.29, and a refractive index of the sealant portion was assumed as 1.45. $SiO_2$, resin and the like were assumed as the sealant portion. The other conditions were similar to those in Example 3.

Figure 21:
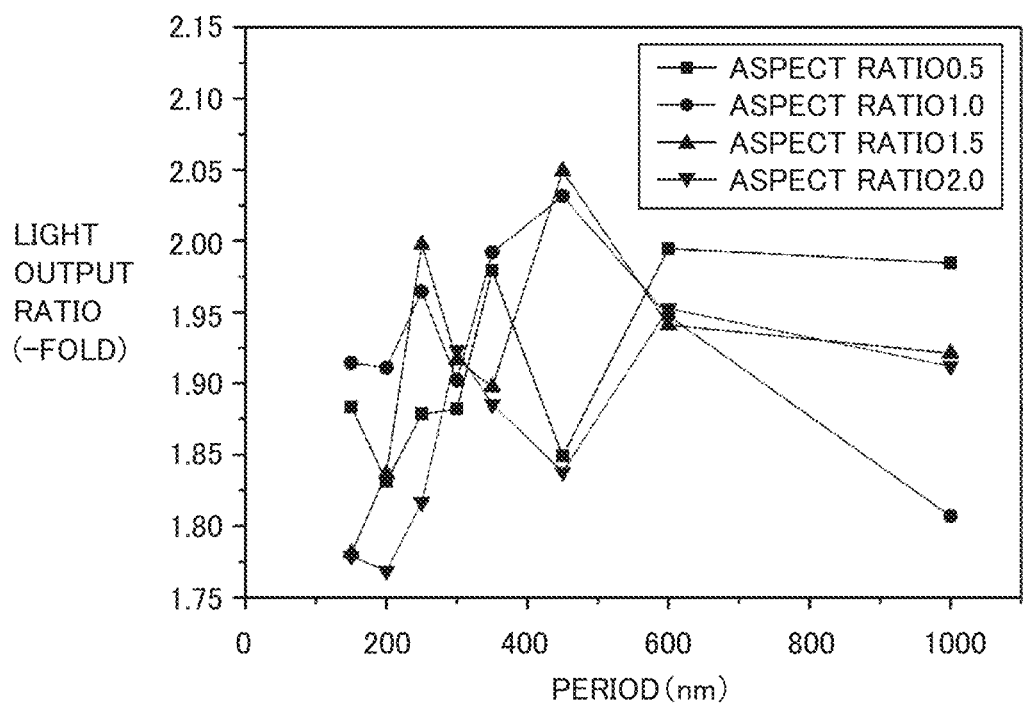
FIG. 21 is a graph showing a simulation calculation result in Example 4.
Figure 22:
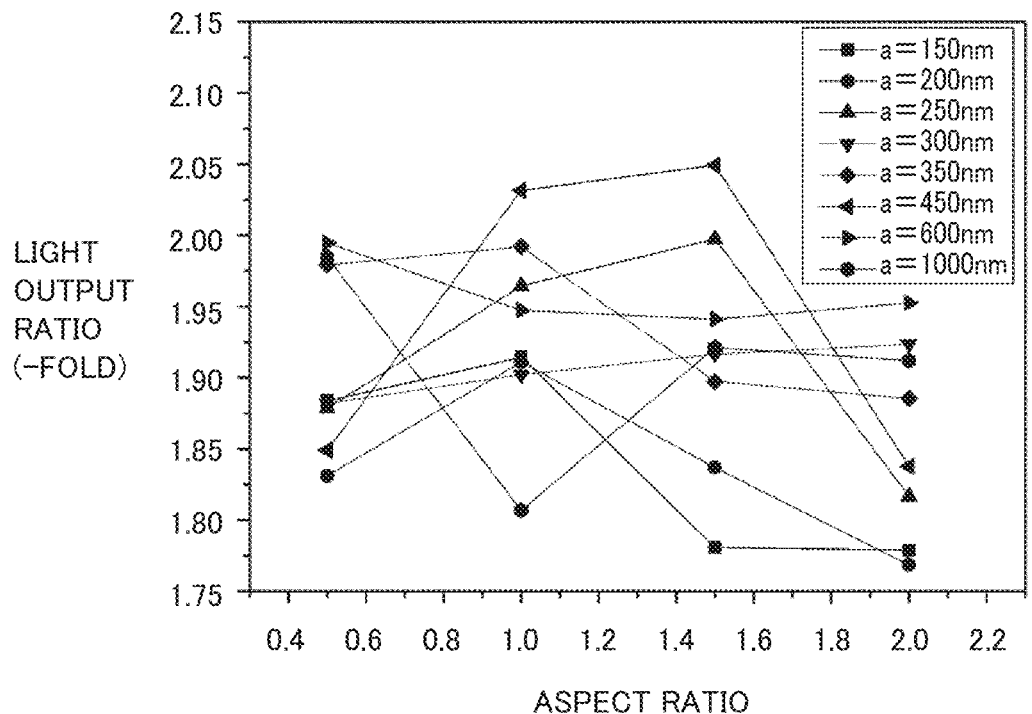
FIG. 22 is a graph showing a simulation calculation result in Example 4.

FIGS. 21 and 22 show numerical values (light output ratio) obtained by calculating the light extraction efficiency at which the light (wavelength: 265 nm) emitted from the AlGaN layer is extracted to the outside (sealant layer) through the AlN substrate and the periodic recessed and projecting structure (conical two-dimensional periodic arrangement (triangular lattice) made of AlN) processed on the surface of the AlN substrate, and standardizing this light extraction efficiency with the calculation result of the light extraction efficiency at which the light is extracted from the flat surface to the outside (air layer) when there is no periodic recessed and projecting structure on the surface of the AlN substrate.

In FIG. 21, the horizontal axis represents the period (unit: nm) of the periodic recessed and projecting structure, and the vertical axis represents the light output ratio. In FIG. 21, data is shown for each of different aspect ratios. In FIG. 22, the horizontal axis represents the aspect ratio, and the vertical axis represents the light output ratio. In FIG. 22, data is shown for each period (a) of the periodic recessed and projecting structure.

Based on the results of Examples 3 and 4, it turns out that, even in the case of the same substrate, wavelength and periodic recessed and projecting structure, the optimum light extraction structure varies depending on the refractive index of the external medium such as the sealing member. However, from the perspective of the production process, it is preferable to extract the light to either the air or the sealant layer from the AlN substrate and the periodic recessed and projecting structure processed on the surface of the AlN substrate, and based on these results, the effect of periodic recessed and projecting structure 21 can be confirmed.

EXAMPLE 5

Based on the structure of the semiconductor light emitting element according to the aforementioned embodiment of the present invention, a semiconductor light emitting element according to Example 5 was fabricated. The configuration of the semiconductor light emitting element according to Example 5 was basically similar to that of the semiconductor light emitting element according to Example 1. An epitaxial layer including the light emitting layer of the semiconductor light emitting element was formed of an AlGaN-based semiconductor similar to that in the aforementioned embodiment, and an emission wavelength of the element was 265 nm.

An electron beam resist was applied onto a substrate surface (light extraction surface) of the fabricated semiconductor light emitting element wafer opposite to the light emitting element layer, and alignment was performed to cover a light emitting portion of the semiconductor light emitting element, and electron beam lithography was performed to fabricate an etching mask pattern. The light emitting portion was a circular region having a diameter of 100 μm, and a lithography region was 900 μm×900 μm, with a center of the light emitting portion being a center of lithography. A lithography pattern was set to have a diameter of 180 nm, a pattern period of 300 nm, and equilateral-triangular lattice pattern arrangement. Next, nickel was deposited in a thickness of 100 nm to 500 nm on the mask pattern by the vacuum vapor deposition method. A reason why nickel was deposited was similar to the reason described in Example 1. After nickel was deposited, the semiconductor light emitting element substrate was immersed in a stripping solution for the electron beam resist, and the resist and nickel located on this resist were removed (liftoff method). In this manner, a mask pattern made of nickel was formed on the rear surface of substrate 16.

Then, similarly to Example 2, the aforementioned semiconductor light emitting element substrate was introduced into an ICP etching apparatus, and etching treatment was performed for 10 to 80 minutes by using a trifluoromethane (CHF$_3$) gas. In the structure like Example 5 having a pattern size smaller than that of Example 2, the etching treatment time was relatively shorter. Finally, in order to remove the mask pattern made of nickel, the semiconductor light emitting element substrate was immersed for 15 minutes in hydrochloric acid heated to a temperature of 60° C. to 90° C. By adjusting the temperature of hydrochloric acid, the presence or absence of development of the minute recessed and projecting structure and the shape thereof could be controlled. Similarly to Example 2, in order to prevent the electrode metal of the semiconductor light emitting element substrate from becoming eroded by hydrochloric acid, a photoresist was preliminarily applied onto the surface of the semiconductor light emitting element substrate having the electrodes formed thereon, and was cured and used as a protective film. After immersion in hydrochloric acid, the semiconductor light emitting element substrate was rinsed with ultrapure water, and the photoresist used as a protective film was dissolved by the stripping solution.

In this manner, the ultraviolet-light-emitting semiconductor light emitting element of Example 5 including the substrate having the periodic recessed and projecting structure having a conical bottom diameter of 300 nm, a period of 300 nm and an aspect ratio of 1 and the minute recessed and projecting structure having an average diameter of 33 nm and an average height of 33 nm was fabricated.

As a comparative example with respect to Example 5, an ultraviolet-light-emitting semiconductor light emitting element before forming the recessed and projecting structure on the substrate was prepared (Comparative Example 4). Then, the light output of these samples of Example 5 and Comparative Example 4 was measured. The result is shown in FIG. 23.

Figure 23:
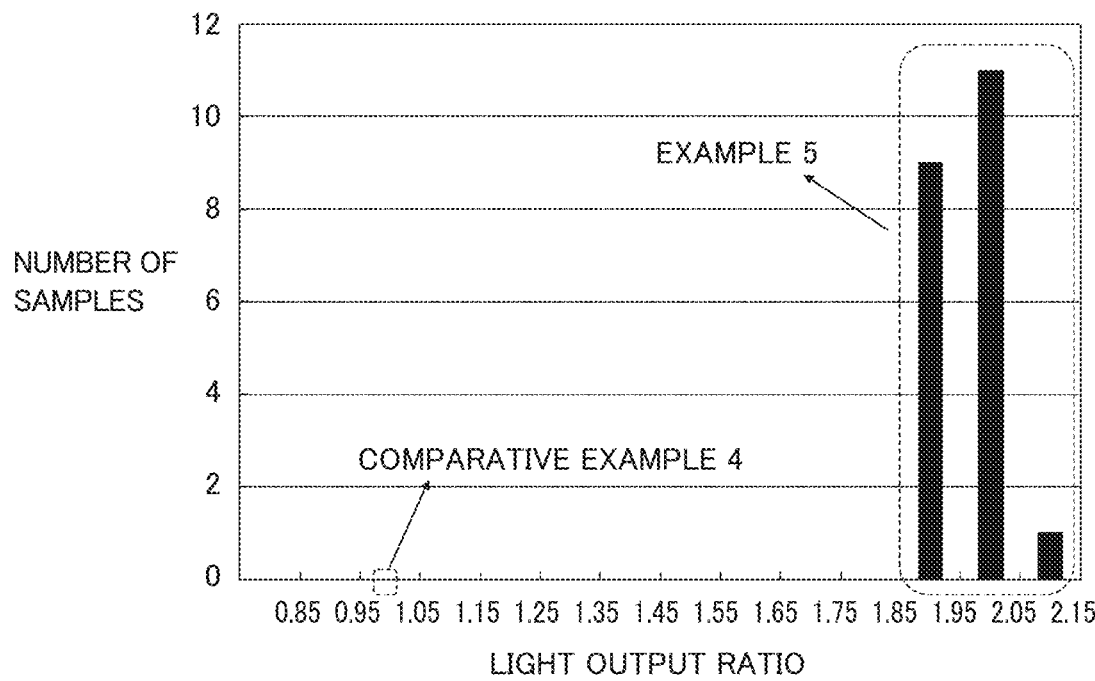
FIG. 23 is a graph showing an experimental result in Example 5.

Referring to FIG. 23, the horizontal axis represents the light output ratio in Example 5 with respect to Comparative Example 4, and the vertical axis represents the number of samples. Assuming that the light output in Comparative Example 4 was 1.00, an average value of the light output ratio in Example 5 was 1.96. As can be seen from FIG. 23, the high light output ratio was obtained in Example 5, and the superiority of the structure having both the periodic recessed and projecting structure and the minute recessed and projecting structure could be proved. In addition, a standard deviation of the light output ratio in Example 5 was 0.07, which corresponded to 3.6% of the average value of the light output ratio. As described above, the sample of Example 5 was also proved to be a semiconductor light emitting element having relatively small variations in light output.

EXAMPLE 6

Based on the structure of the semiconductor light emitting element according to the aforementioned embodiment of the present invention, a semiconductor light emitting element according to Example 6 was fabricated. The configuration of the semiconductor light emitting element according to Example 6 was basically similar to that of the semiconductor light emitting element according to Example 1. A material of an epitaxial layer including the light emitting layer of the semiconductor light emitting element and an emission wavelength of the element were similar to those in Example 5 described above.

Similarly to Example 5, by electron beam lithography, an etching mask pattern was fabricated on a substrate surface (light extraction surface) of the fabricated semiconductor light emitting element wafer opposite to the light emitting element layer. The light emitting portion was a circular region having a diameter of 100 µm, and a lithography region was 900 µm×900 µm, with a center of the light emitting portion being a center of lithography. A lithography pattern was set to have a diameter of 200 nm, a pattern period of 400 nm, and equilateral-triangular lattice pattern arrangement. Next, similarly to Example 5, nickel was deposited in a thickness of 100 nm to 500 nm on the mask pattern by the vacuum vapor deposition method. After nickel was deposited, the semiconductor light emitting element substrate was immersed in a stripping solution for the electron beam resist, and the resist and nickel located on this resist were removed (liftoff method). In this manner, a mask pattern made of nickel was formed on the rear surface of substrate 16.

Then, similarly to Example 2, the aforementioned semiconductor light emitting element substrate was introduced into an ICP etching apparatus, and etching treatment was performed for 10 to 80 minutes by using a trifluoromethane ($CHF_3$) gas. Finally, in order to remove the mask pattern made of nickel, the semiconductor light emitting element substrate was immersed for 15 minutes in hydrochloric acid heated to a temperature of 60° C. to 90° C. Similarly to Example 2, in order to prevent the electrode metal of the semiconductor light emitting element substrate from becoming eroded by hydrochloric acid, a photoresist was preliminarily applied onto the surface of the semiconductor light emitting element substrate having the electrodes formed thereon, and was cured and used as a protective film. After immersion in hydrochloric acid, the semiconductor light emitting element substrate was rinsed with ultrapure water, and the photoresist used as a protective film was dissolved by the stripping solution.

In this manner, the ultraviolet-light-emitting semiconductor light emitting element of Example 6 including the substrate having the periodic recessed and projecting structure having a conical bottom diameter of 400 nm, a period of 400 nm and an aspect ratio of 1 and the minute recessed and projecting structure having an average diameter of 33 nm and an average height of 33 nm was fabricated.

As a comparative example with respect to Example 6, an ultraviolet-light-emitting semiconductor light emitting element before forming the recessed and projecting structure on the substrate was prepared (Comparative Example 5). Then, the light output of these samples of Example 6 and Comparative Example 5 was measured. The result is shown in FIG. 24.

Figure 24:
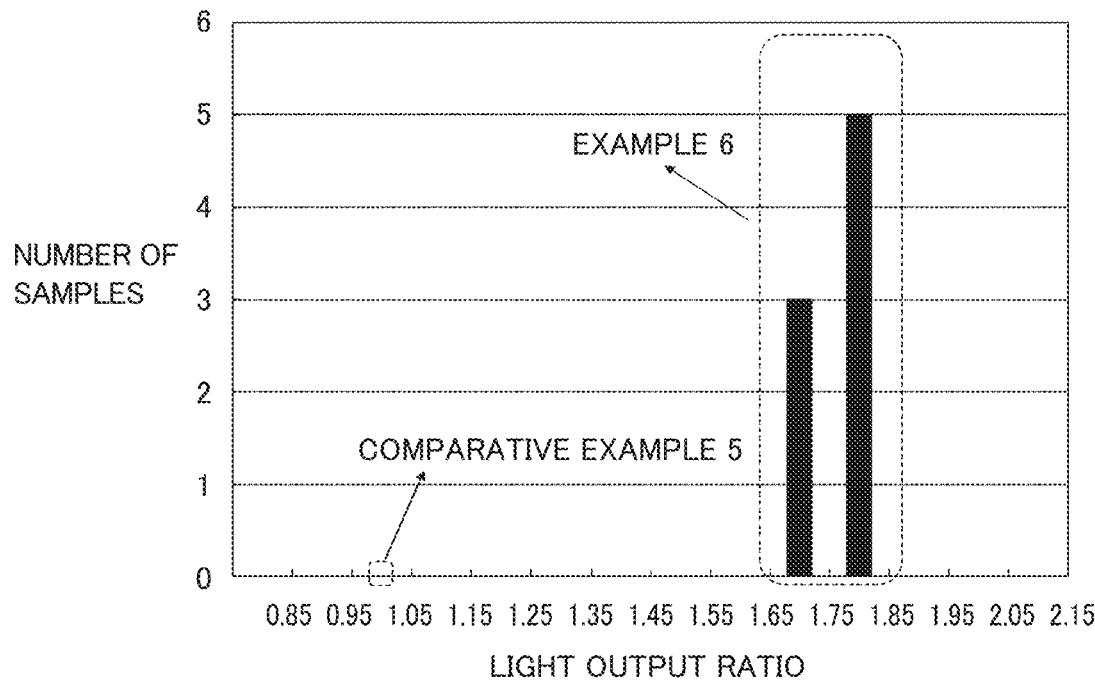
FIG. 24 is a graph showing an experimental result in Example 6.

Referring to FIG. 24, the horizontal axis represents the light output ratio in Example 6 with respect to Comparative Example 5, and the vertical axis represents the number of samples. Assuming that the light output in Comparative Example 5 was 1.00, an average value of the light output ratio in Example 6 was 1.79. As can be seen from FIG. 24, the high light output ratio was obtained in Example 6 as well similarly to Example 5, and the superiority of the structure having both the periodic recessed and projecting structure and the minute recessed and projecting structure could be proved. In addition, as can be seen from FIG. 24, similarly to the sample of Example 5, the sample of Example 6 was also proved to be a semiconductor light emitting element having relatively small variations in light output.

EXAMPLE 7

Based on the structure of the semiconductor light emitting element according to the aforementioned embodiment of the present invention, a semiconductor light emitting element according to Example 7 was fabricated. The configuration of the semiconductor light emitting element according to Example 7 was basically similar to that of the semiconductor light emitting element according to Example 1. A material of an epitaxial layer including the light emitting layer of the semiconductor light emitting element and an emission wavelength of the element were similar to those in Example 5 described above.

Similarly to Example 5, by electron beam lithography, an etching mask pattern was fabricated on a substrate surface (light extraction surface) of the fabricated semiconductor light emitting element wafer opposite to the light emitting element layer. The light emitting portion was a circular region having a diameter of 100 µm, and a lithography region was 900 µm×900 µm, with a center of the light emitting portion being a center of lithography. A lithography pattern was set to have a diameter of 400 nm, a pattern period of 1000 nm, and equilateral-triangular lattice pattern arrangement. Next, similarly to Example 5, nickel was deposited in a thickness of 100 nm to 500 nm on the mask pattern by the vacuum vapor deposition method. After nickel was deposited, the semiconductor light emitting element substrate was immersed in a stripping solution for the electron beam resist, and the resist and nickel located on this resist were removed (liftoff method). In this manner, a mask pattern made of nickel was formed on the rear surface of substrate 16.

Then, similarly to Example 2, the aforementioned semiconductor light emitting element substrate was introduced into an ICP etching apparatus, and etching treatment was performed for 10 to 80 minutes by using a trifluoromethane ($CHF_3$) gas. In the structure like Example 5 having a relatively small pattern size, the aforementioned etching treatment time was shorter. Conversely, in the structure like Example 7 having a relatively large pattern size, the aforementioned etching treatment time was longer.

Finally, in order to remove the mask pattern made of nickel, the semiconductor light emitting element substrate was immersed for 15 minutes in hydrochloric acid heated to a temperature of 60° C. to 90° C. Similarly to Example 2, in order to prevent the electrode metal of the semiconductor light emitting element substrate from becoming eroded by hydrochloric acid, a photoresist was preliminarily applied onto the surface of the semiconductor light emitting element substrate having the electrodes formed thereon, and was cured and used as a protective film. After immersion in hydrochloric acid, the semiconductor light emitting element substrate was rinsed with ultrapure water, and the photoresist used as a protective film was dissolved by the stripping solution.

In this manner, the ultraviolet-light-emitting semiconductor light emitting element of Example 7 including the substrate having the periodic recessed and projecting structure having a conical bottom diameter of 1000 nm, a period of 1000 nm and an aspect ratio of 1 and the minute recessed and projecting structure having an average diameter of 33 nm and an average height of 33 nm was fabricated.

As a comparative example with respect to Example 7, an ultraviolet-light-emitting semiconductor light emitting element before forming the recessed and projecting structure on the substrate was prepared (Comparative Example 6). Then, the light output of these samples of Example 7 and Comparative Example 6 was measured. The result is shown in FIG. 25.

Figure 25:
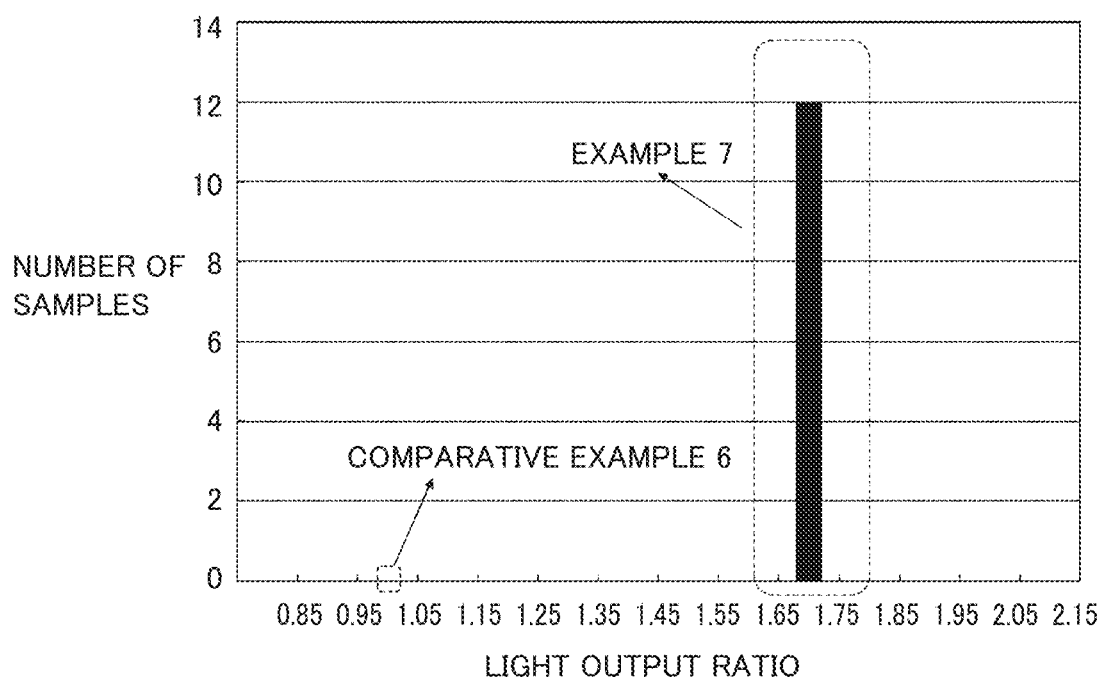
FIG. 25 is a graph showing an experimental result in Example 7.

Referring to FIG. 25, the horizontal axis represents the light output ratio in Example 7 with respect to Comparative Example 6, and the vertical axis represents the number of samples. Assuming that the light output in Comparative Example 6 was 1.00, an average value of the light output ratio in Example 7 was 1.69. As can be seen from FIG. 25, the high light output ratio was obtained in Example 7 as well similarly to Example 5, and the superiority of the structure having both the periodic recessed and projecting structure and the minute recessed and projecting structure could be proved. In addition, as can be seen from FIG. 25, similarly to the sample of Example 5, the sample of Example 7 was also proved to be a semiconductor light emitting element having relatively small variations in light output.

EXAMPLE 8

As a semiconductor light emitting element according to Example 8, fabricated was a semiconductor light emitting element in which the period of the periodic recessed and projecting structure (pattern period: 300 nm) fabricated on the light extraction surface of the aforementioned semiconductor light emitting element wafer according to Example 1 was changed to 600 nm. In addition, in order to fix the aspect ratio to 1, the diameter and the height were set to correspond to the aforementioned pattern period. The aforementioned semiconductor light emitting element according to Example 8 was similar to the semiconductor light emitting element according to Example 1, except for the pattern period, the diameter and the height described above. The fabrication conditions were also similar to those in Example 1, except that the treatment time of etching treatment was 30 to 80 minutes.

In this manner, the ultraviolet-light-emitting semiconductor light emitting element including the substrate having the periodic recessed and projecting structure having a conical bottom diameter of 600 nm, a period of 600 nm and a height of 600 nm was fabricated as the semiconductor light emitting element according to Example 8.

As a comparative example with respect to Example 8, an ultraviolet-light-emitting semiconductor light emitting element before forming the recessed and projecting structure on the substrate was prepared (Comparative Example 7). Then, the light output of these samples of Example 8 and Comparative Example 7 was measured. The result is shown in FIG. 26.

Figure 26:
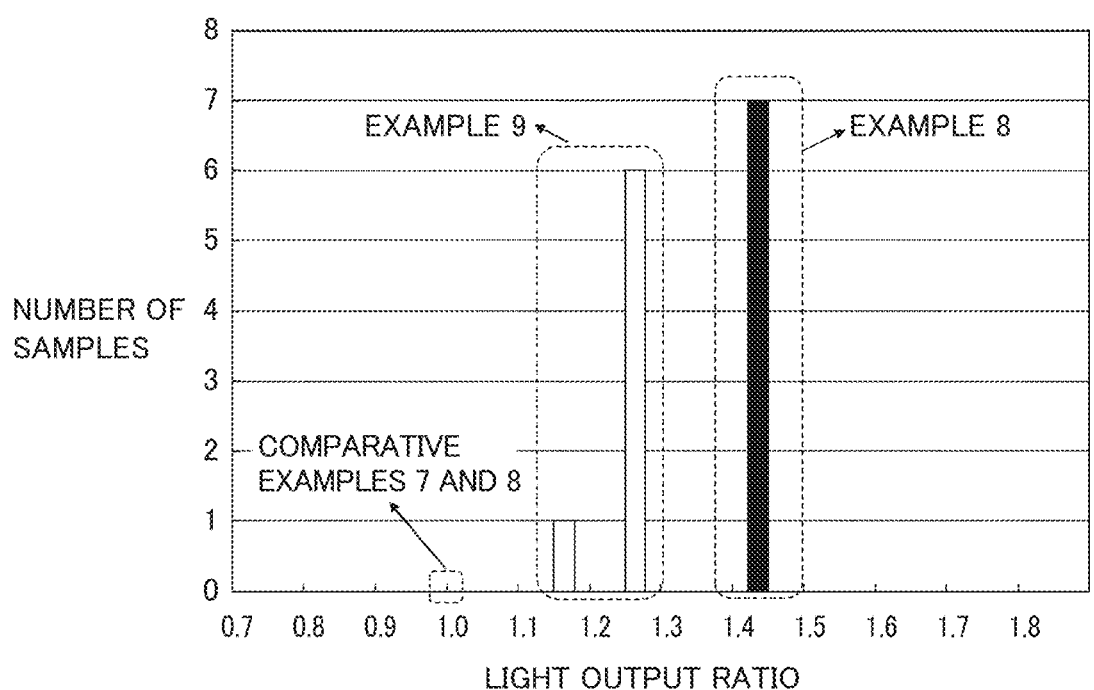
FIG. 26 is a graph showing experimental results in Examples 8 and 9.

Referring to FIG. 26, the horizontal axis represents the light output ratio in Example 8 with respect to Comparative Example 7, and the vertical axis represents the number of samples. Assuming that the light output in Comparative Example 7 was 1.00, an average value of the light output ratio in Example 8 was 1.446. As compared with Examples 2 and 8 having the same periodic recessed and projecting structure (period: 600 nm) as well as Comparative Example 7 not having the periodic recessed and projecting structure, the light output ratio decreases in the order of Example 2>Example 8>Comparative Example 7, and the superiority of the structure having both the periodic recessed and projecting structure and the minute recessed and projecting structure could be proved.

EXAMPLE 9

As a semiconductor light emitting element according to Example 9, fabricated was a semiconductor light emitting element in which the period of the periodic recessed and projecting structure (pattern period: 300 nm) fabricated on the light extraction surface of the aforementioned semiconductor light emitting element wafer according to Example 1 was changed to 1000 nm. In addition, in order to fix the aspect ratio to 1, the diameter and the height were set to correspond to the aforementioned pattern period. The aforementioned semiconductor light emitting element according to Example 9 was similar to the semiconductor light emitting element according to Example 1, except for the pattern period, the diameter and the height described above. The fabrication conditions were also similar to those in Example 1, except that the treatment time of etching treatment was 30 to 80 minutes.

In this manner, the ultraviolet-light-emitting semiconductor light emitting element including the substrate having the periodic recessed and projecting structure having a conical bottom diameter of 1000 nm, a period of 1000 nm and a height of 1000 nm was fabricated as the semiconductor light emitting element according to Example 9.

As a comparative example with respect to Example 9, an ultraviolet-light-emitting semiconductor light emitting element before forming the recessed and projecting structure on the substrate was prepared (Comparative Example 8). Then, the light output of these samples of Example 9 and Comparative Example 8 was measured. The result is shown in FIG. 26.

Referring to FIG. 26, the horizontal axis represents the light output ratio in Example 9 with respect to Comparative Example 8, and the vertical axis represents the number of samples. Assuming that the light output in Comparative Example 8 was 1.00, an average value of the light output ratio in Example 9 was 1.26. As compared with Examples 7 and 9 having the same periodic recessed and projecting structure (period: 1000 nm) as well as Comparative Example 8 not having the periodic recessed and projecting structure, the light output ratio decreases in the order of Example 7>Example 9>Comparative Example 8, and the superiority of the structure having both the periodic recessed and projecting structure and the minute recessed and projecting structure could be proved.

Figure 27:
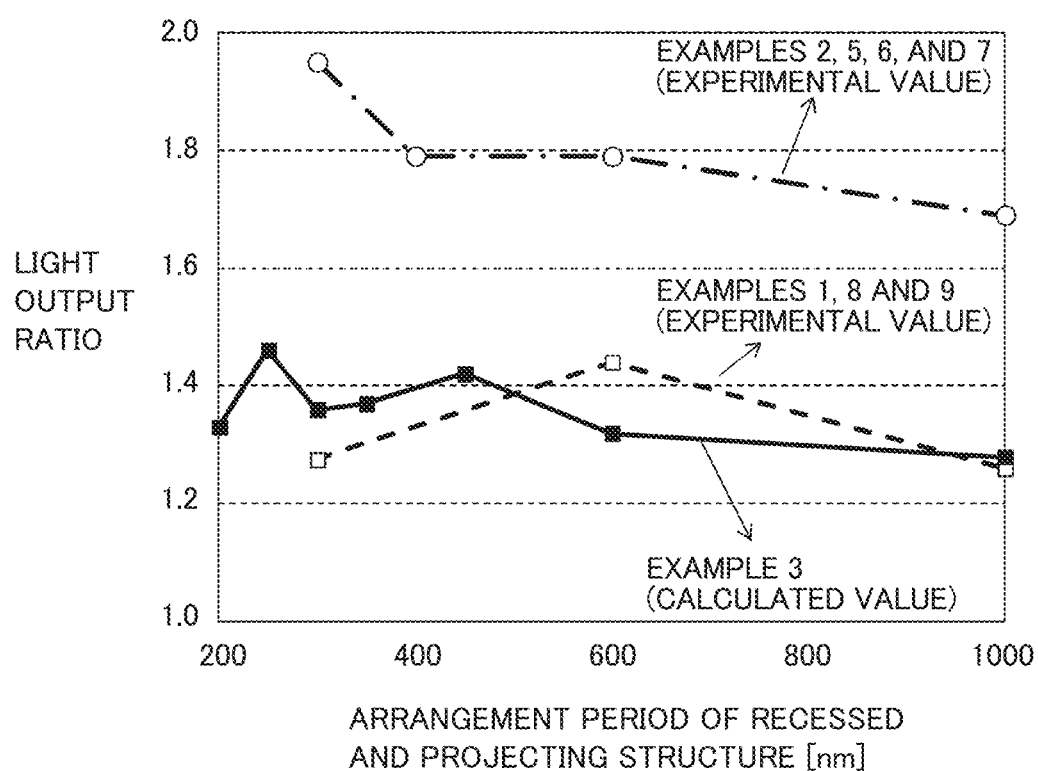
FIG. 27 is a graph showing experimental values and a simulation calculation result in Examples.

As shown in FIG. 27, the light output ratio obtained for Examples 1, 8 and 9 described above is well matched with the calculation result described in Example 3. This supports the validity of the guideline about optimization of the light extraction structure obtained from the simulation calculation. FIG. 27 also plots the light output ratio obtained for Examples 2 and 5 to 7. In FIG. 27, the horizontal axis represents the arrangement period (unit: nm) of the recessed and projecting structure, and the vertical axis represents the light output ratio.

As can also be seen from FIG. 27, the tendency of the light output ratio with respect to the arrangement period of the periodic recessed and projecting structure is nearly matched with the simulation calculation result. Namely, FIG. 27 supports the fact that an increment of the absolute value of the light output ratio is due to the effect of the enhanced light extraction efficiency caused by addition of the minute recessed and projecting structure.

It should be understood that the embodiments and the examples disclosed herein are illustrative and not limitative in every respect. The scope of the present invention is defined by the terms of the claims, rather than the description above, and is intended to include any modifications within the scope and meaning equivalent to the terms of the claims.

INDUSTRIAL APPLICABILITY

The present invention is particularly advantageously applied to a semiconductor light emitting element that emits the short-wavelength light.

REFERENCE SIGNS LIST 11 positive electrode, 12 p-type semiconductor layer, 13 active layer, 14 negative electrode, 15 n-type semiconductor layer, 16 substrate, 16A rear surface, 21 periodic recessed and projecting structure, 22 minute recessed and projecting structure.

The invention claimed is:

1. A method for manufacturing a semiconductor light emitting element, comprising:
    preparing an element member that forms a semiconductor light emitting element including a semiconductor layer including a light emitting layer;
    forming a mask layer including a pattern on a region of the element member that forms a light extraction surface of the semiconductor light emitting element; and
    forming a periodic recessed and projecting structure by partially removing the region that forms the light extraction surface by etching using the mask layer as a mask; wherein
    the mask layer is a metal mask layer;
    in the forming a periodic recessed and projecting structure, the periodic recessed and projecting structure is formed and a minute recessed and projecting structure is formed on a surface of the periodic recessed and projecting structure, by performing dry etching using an etching gas;
    the periodic recessed and projecting structure has a period that exceeds 0.5 times a wavelength of light extracted from the semiconductor light emitting element; and
    the minute recessed and projecting structure has an average diameter that is not more than 0.5 times the wavelength of the light; wherein
    the forming the periodic recessed and projecting structure includes:
        the performing dry etching; and
        removing the metal mask layer;
    the period of the periodic recessed and projecting structure is the same as a period of the metal mask layer;
    in the performing dry etching, a reactant of the metal mask layer and the etching gas adheres to the region that forms the light extraction surface.

2. The method for manufacturing a semiconductor light emitting element according to claim 1, wherein the metal mask layer includes a nickel film.

3. The method for manufacturing a semiconductor light emitting element according to claim 1, wherein the etching gas includes a carbon-containing fluorine-based gas.

4. The method for manufacturing a semiconductor light emitting element according to claim 1, wherein the minute recessed and projecting structure includes projections each having a conical shape or a semi-elliptical spherical shape.

5. The method for manufacturing a semiconductor light emitting element according to claim 1, wherein the etching gas includes a fluorine-based gas.

6. The method for manufacturing a semiconductor light emitting element according to claim 1, wherein, in the removing the metal mask layer, the metal mask layer is removed by acid treatment.

7. The method for manufacturing a semiconductor light emitting element according to claim 1, wherein the period of the periodic recessed and projecting structure exceeds the wavelength of the light.

* * * * *